(12) United States Patent
De Lameillieure

(10) Patent No.: US 7,139,318 B2
(45) Date of Patent: Nov. 21, 2006

(54) METHOD AND APPARATUS FOR THE COMPRESSION AND/OR TRANSPORT AND/OR DECOMPRESSION OF A DIGITAL SIGNAL

(75) Inventor: Jan L. P. De Lameillieure, Kortrijk (BE)

(73) Assignee: Scientific-Atlanta, Inc., Lawrenceville, GA (US)

( * ) Notice: Subject to any disclaimer, the term of this patent is extended or adjusted under 35 U.S.C. 154(b) by 484 days.

(21) Appl. No.: 10/757,216

(22) Filed: Jan. 14, 2004

(65) Prior Publication Data

US 2004/0146106 A1 Jul. 29, 2004

Related U.S. Application Data

(62) Division of application No. 09/573,688, filed on May 19, 2000, now Pat. No. 6,931,058.

(30) Foreign Application Priority Data

May 21, 1999 (EP) .................................. 99870108

(51) Int. Cl.
*H04N 7/12* (2006.01)
(52) U.S. Cl. ................................. 375/240.25
(58) Field of Classification Search ........... 375/240.01, 375/240.02, 240.12, 240.21, 240.25, 240.26, 375/240.27; *H04N 7/12*
See application file for complete search history.

(56) References Cited

U.S. PATENT DOCUMENTS 4,791,483 A 12/1988 Miller 5,592,161 A 1/1997 Kuwaoka
5,831,689 A 11/1998 Boie

FOREIGN PATENT DOCUMENTS

| EP | 0 361 761 A2 | 4/1990 |
|---|---|---|
| EP | 0 749 237 A1 | 12/1996 |
| EP | 0 763 899 A1 | 3/1997 |
| WO | WO 83/03727 | 10/1983 |
| WO | WO 97/21274 | 6/1997 |

OTHER PUBLICATIONS

Hartwig S. et al.: "Digitale Bildcodierung (Teil 9). /Digitales Fernsehen: Vom Labor Zum Standard" Fernseh und Kinotechnik, vol. 46, No. 10, Oct. 1, 1992, pp. 687-696, XP000315576 ISSN: 0015-0142.

Vyver: "Barco Lynx: Digital Optical Solution for if Transport of Television Signals", 1997, pp. 709-717.

"Characteristics of Systems for Monochrome and Colour Television", Recommendations and Reports, Rec. 470-2, Rep. 624-3.

Van Buul: "Hybrid D-PCM, A Combination of PCM and DPCM", IEEE Transactions on Communications, vol. Com-26, No. 3, Mar. 1976, pp. 362-368.

*Primary Examiner*—Young Lee

(57) ABSTRACT

A method is described for compressing and/or transporting and/or decompressing a digital signal. The most significant bits of a sample of the digital signal are compressed and transported as a compressed transport sample. Methods are used to improve the compression and transport as hybrid DPCM and a dynamic shift of clip range of prediction errors. For every sample, not only a compressed transport sample but also a residual transport sample is transmitted. The residual transport sample is either equal to the least significant bits of the sample or equal to a substitution value which is a function of the clipping error from the compression of the most significant bits of the said sample. Apparatuses are described for compression and/or transport and/or decompression of a digitized television IF signal according to the method.

7 Claims, 9 Drawing Sheets

METHOD AND APPARATUS FOR THE COMPRESSION AND/OR TRANSPORT AND/OR DECOMPRESSION OF A DIGITAL SIGNAL

CROSS-REFERENCE TO RELATED APPLICATION

This application is a divisional application of U.S. patent application Ser. No. 09/573,688, filed May 19, 2000 now U.S. Pat. No. 6,931,058. This application claims the benefit of European patent application No. 99870108.0 filed May 21, 1999, the contents thereof being incorporated herein by reference.

FIELD OF THE INVENTION

The present invention relates to methods and to apparatuses for the compression and/or transport and/or decompression of digital signals, and for the compression and/or transport and/or decompression of digitized television IF (Intermediate Frequency) signals in particular. The primary field of application is that of cable television systems.

DESCRIPTION OF RELATED ART

Methods and apparatuses are known for the transport of television signals over analog communication paths as, e.g., cable television networks, whereby television signals are transported as analog IF signals or modulated analog IF signals, the signals having a format according to one of the existing transmission standards as mentioned in ITU-R Recommendation 470-2, "Television Systems", 1986.

Methods are known to digitize IF signals. EP-0749237 and EP-0763899 of THOMSON multimedia S.A. describe such methods.

Methods are known to transport an uncompressed digitized television IF signal over a transport channel. In the Proceedings of the International TV Symposium, pp. 709–717, Montreux 1997, F. Van de Vyver, "BARCO Lynx: Digital Optical Solution for IF Transport of Television Signals", a method is described for transport of a digitized television IF signal over an optical fiber.

Methods are known to compress and transport digital signals, including digitized baseband audio and/or video signals. In television systems with digital compression and transport, these methods are used to compress audio and video separately before being multiplexed into one bit-stream of compressed data. For colored video, the bit-stream is in its turn a multiplex of occasional motion information and separately compressed components (e.g., luminance and color differences).

However, in case of a digitized television IF signal, which is a sampled carrier modulated by the composite signal of audio and all video components (and occasional additional data), all components are completely merged, making separate compression of each of them impossible. Therefore, typical compression techniques for video and audio cannot be used for the compression and/or transport of digitized television IF signals.

When a low implementation complexity and a lossless or nearly lossless compression are required, the compression ratio cannot be high. A possible choice is a split of the input in LSB's (Least Significant Bits*) which are not compressed and MSB's (Most significant Bits) which are compressed with predictive coding. In predictive coding, samples are coded one by one. For each sample, first a predictor calculates a prediction of the coded sample based on previously coded samples. Then the prediction error, which is the difference between a sample and its prediction, is transmitted to the receiver. There, the same prediction, calculated in the decoder, is added back to the received prediction error. Consequently, the decoder is a recursive loop containing an adder and a predictor based on previously decoded samples. In order to reduce the bit-rate, the prediction errors can be quantized and/or clipped. This causes differences between the decoder output and the original. These differences are called coding errors. When there are coding errors in the MSB's of a sample due to quantization or clipping of prediction errors, transmission of the LSB's of the said sample is useless and the available channel bit-rate is not optimally used.

*Numerous reference signs in the form of acronyms, abbreviations, representations and the like are used throughout this specification; see the "Reference Key" at the end of this specification.

Predictive coding or Differential Pulse Code Modulation (DPCM) is often combined with Variable Length Coding (VLC) or Huffman coding of the prediction errors. VLC coding significantly improves the compression, but considerably increases the complexity. In order to guarantee compression in the case of DPCM without VLC, the transmitted prediction errors should be quantized and/or clipped to a range called "clip range". However, in applications of lossless or nearly lossless coding, quantization should be avoided and the prediction errors should be as much as possible within the clip range.

In WO 83/03727, W. Kehler discloses a "Modulation and coding method with range prediction and reduced bit rate adapted to a signal", which is an improved DPCM scheme that predicts a range called prediction range instead of a single prediction value. Instead of the prediction error, the position of the coded sample within the prediction range is transmitted. The prediction range can be used as clip range.

Predictive coding or DPCM is based on a recursive loop in the decoder, and is therefore sensitive to transmission errors. The robustness against transmission errors can be improved by Hybrid DPCM (HDPCM) as published by Van Buul in "Hybrid DPCM, a Combination of PCM and DPCM", IEEE Trans. Commun., Vol. COM-26, No. 3, pp. 362–368, March 1978. HDPCM has been applied by Van Buul to video only. After a transmission error, or when the decoder does not start decoding the transmitted bit-stream from the beginning (i.e., after a random access), the predictions in the DPCM decoder are not the same as in the DPCM encoder. HDPCM forces the decoder predictions to converge to the encoder predictions, as will be described in the enabling description of the first embodiment below. However, with HDPCM, when a decoder prediction converges almost completely to the encoder prediction after a transmission error or after a random access, a big prediction error can be decoded by the HDPCM decoder as a prediction error of nearly the same absolute value but with the opposite sign (described more in detail below), causing severe divergence between decoder and encoder predictions. This is especially the case with digitized television IF signals, where big prediction errors occur more often than in the case of video signals.

SUMMARY OF THE INVENTION

It is an aim of the present invention to provide a method for processing a digital signal, so that it can be compressed and transported over an existing transport channel featuring a known maximum bandwidth and/or a known maximum bit rate which is lower than the bandwidth respectively bit-rate of the said digital signal, thereby reducing the bit rate of the digital signal to be transmitted, and thereby keeping the distortions of the reproduced digital signal after compression, transport and decompression to a minimum. When the said digital signal is a digitized television IF signal, the visible and audible distortions should remain minimum. It is an aim to keep the implementation complexity of the method of this invention low and to keep the disclosed compression lossless or nearly lossless.

This is achieved by a method for the transmission of a first digital signal from a first location over a transport channel to one or more second locations where it is received as a second digital signal, which is substantially equal to the first digital signal. A sample of the first digital signal, represented by M bits, being the total of N most significant bits and M−N least significant bits, N being smaller than or equal to M, is transported over the transport channel as a transport sample of a transport channel bit stream. The N most significant bits are compressed to N−C bits, C being smaller than N and larger than 0. The said N−C bits after compression are transported as a "compressed transport sample". Next to the (N−C)-bit compressed transport sample, there is a (M−N)-bit "residual transport sample" which is transported over the transport channel.

The N−C bits of the compressed transport sample are obtained through predictive coding of the N most significant bits of the corresponding sample of the first digital signal, whereby to each sample of the first digital signal corresponds at least a "prediction", a "prediction error" and a "clipping error". The prediction represents the predicted N most significant bits of the sample of the first digital signal whereby the prediction is based on previously compressed samples. The prediction error represents the difference between the N most significant bits of the sample of the first digital signal and the said prediction. The clipping error represents the difference between the prediction error and a "clipped prediction error", which is the prediction error clipped by a first clipper to a "clip range" [A . . . B], A and B being integers and B−A being equal to or smaller than $2^{(N-C)}-1$. So, the clipped prediction error can be represented by means of N−C bits. The residual transport sample, represented by M−N bits, is equal to the M−N least significant bits of the said sample of the first digital signal in the case that the said prediction error corresponding to the said sample of the first digital signal is in the range [(A+1) . . . (B−1)]. In the other case, it is equal to a substitution value which is a function of on one hand the clipping error corresponding to the said sample of the first digital signal, and on the other hand the M−N least significant bits of the said sample of the first digital signal, whereby the output value of the said function of the clipping error and the least significant bits can be represented by M−N bits. It is preferred that, in the case that the prediction error corresponding to the said sample of the first digital signal is not in the range [(A+1) . . . (B−1)]. The said substitution value (CE) is obtained by first taking the absolute value of the clipping error of the said sample (S1) of the first digital signal (DS2), then clipping the said absolute value to a range which can be represented by P bits, with P equal or less than M−N, and then using the remaining M−N−P bits for the output of a quantization to M−N−P levels of the M−N least significant bits of the said sample of the first digital signal.

The compressed transport sample can be the said clipped prediction error, but is by preference as in the range [A . . . B] wrapped around sum of the clipped prediction error and a mapped value of the prediction. The mapped value of the prediction is the prediction mapped on a range [D . . . E], E and D being integers and E−D being equal to or smaller than $2^{(N-C)}-1$. The prediction is by preference mapped or quantized in a non-uniform way, such that the quantization is fine for prediction values corresponding to small input amplitudes and rough for prediction values corresponding to big amplitudes of the first digital signal.

Of the said clip range [A . . . B], B−A is by preference smaller than $2^{(N-C)}-1$ if the compressed transport sample is the in the range [A . . . B] wrapped around sum of clipped prediction error and mapped prediction.

The residual transport signal is by preference transported in PCM.

The clip range [A . . . B] can be fixed (being not shiftable) for all samples, but is by preference shiftable in every sample over a shift sh, the shift sh in a sample being a function of one or more actual parameters of the said sample of the first digital signal, the clip range then being [A+sh . . . B+sh]. When the to be transported digital signal is a digitized television IF signal, the said actual parameters are the estimated phase of the IF carrier and the estimated luminance of the video signal comprised in the television IF signal.

The aims of the invention are also achieved by other methods which combine only some of the method steps of the "preferred" method of the present invention described before, albeit with a lower grade compression and/or transport and/or decompression of a digital signal.

A first method thus combining only some of the method steps of the preferred method of the present invention is a method for the transmission of a first digital signal from a first location over a transport channel to one or more second locations where it is received as a second digital signal which is substantially equal to the first digital signal. A sample of the first digital signal represented by N bits is transported over the transport channel as a transport sample represented by N−C bits, C being smaller than N and larger than 0. These N−C bits are obtained through predictive coding of the N bits of the sample of the first digital signal, whereby with each sample of the first digital signal corresponds at least a prediction representing the predicted N bits of the sample of the first digital signal and a prediction error representing the difference between the N bits of the sample of the first digital signal and the said prediction. The prediction is based on previously compressed samples. The transport sample is an in the range [A . . . B] wrapped around sum of the prediction error clipped to a range named clip range [A . . . B], A and B being integers and B−A being equal to $2^{(N-C)}-1$, and a mapped value of the prediction which has been mapped on a range [D . . . E], E and D being integers and E−D being equal to or smaller than $2^{(N-C)}-1$.

A second method thus combining only some of the method steps of the preferred method of the present invention is a method for the transmission of a first digital signal from a first location over a transport channel to one or more second locations where it is received as a second digital signal which is substantially equal to the first digital signal. A sample of the first digital signal represented by N bits is transported over the transport channel as a transport sample represented by N−C bits, C being smaller than N and larger than 0. These N−C bits are obtained through predictive coding of the N bits of the same of the first digital signal, whereby to each sample of the first digital signal corresponds at least a prediction representing the predicted N bits of the sample of the first digital signal and a prediction error representing the difference between the N bits of the sample of the first digital signal and the said prediction. The prediction is based on previously compressed samples. The transport sample is the prediction error clipped to a range named clip range, which can be represented by means of N–C bits, whereby the clip range is shiftable in function of one or more actual parameters of the first digital signal.

It is furthermore an aim of the present invention to provide an apparatus for the compression and/or transport and/or decompression of a digital signal, and of a digitized television IF signal in particular.

Transmitting apparatuses are provided wherein a digitized television IP signal is transformed into a transport channel bit-stream for transmission of the said digitized television IF signal from a first location to one or more second locations. Receiving apparatuses that correspond to the provided transmitting apparatuses are also provided. These said receiving apparatuses transform a transport channel bit-stream, containing a first digitized television IF signal which has been compressed according to the present invention, into a second digitized television IF signal by a method corresponding to the method of compression of the said first digitized television IF signal.

A transmitting apparatus is provided, comprising a slitter, an encoder CPCM-core, an output for the transport channel bit-stream, a first location clipping detector, a first location substitutor, and an occasional first location MSB corrector. Transmitting apparatuses are provided wherein there is in addition a combination of a prediction mapper and a wrap-around adder and/or a combination of a phase locked-loop, a luminance estimator, and a shift estimator.

A short description of the above listed parts of the provided transmitting apparatuses is given below. For a more extended description of these listed parts one is referred to the description of the first embodiment of the present invention.

In the splitter, a sample of the digitized television IF signal is split into N most significant bits and M–N least significant bits. In the encoder DPCM-core, the N most significant bits of a sample of the said digitized television IF signal are compressed into an N–C-bit word clipped prediction error. In the first location clipping detector, a first location PCM-bit substitution control signal is generated, indicating what is to be transmitted as residual transport sample, either the M–N least significant bits of the sample of the first digitized television IF signal, or a substitution value being a function of on one hand the clipping error corresponding to the said sample of the first digitized television IF signal, and on the other hand the M–N least significant bits of the said sample of the first digitized television IF signal. In the first location substitutor, the M–N least significant bits are substituted by a substitution value according to the first location PCM-bit substitution control signal. The occasional first location MSB corrector adds to or subtracts from the sum of prediction and the clipped prediction error, the output value of mapping by means of a second function of the received residual transport sample, according to the second location PCM-bit substitution control signal and the sign signal.

In the prediction mapper, a mapped value is generated from an encoder prediction from the encoder DPCM-core or the sum of the prediction and the shift. In the wrap-around adder, a mapped prediction is added to a corresponding clipped prediction error, the sum then being wrapped around to obtain a compressed transport sample.

In the phase-locked loop, the phase of the IF carrier of the digitized television IF signal is estimated, based on a locally decoded television IF signal from the encoder DPCM-core. In the luminance estimator, the luminance of the video signal contained in the digitized television IF signal is estimated, based on a decoded television IF signal and on the estimated phase of the IF carrier, resulting in an estimated luminance. In the shift estimator, a shift is estimated, based on the estimated phase of the IF carrier and on the estimated luminance.

The combination of a phase-locked loop, a luminance estimator, and a shift estimator provides a shiftable clip range for the prediction errors. In this case, the encoder DPCM-core contains a clipper that clips the prediction error to a range that is shifted.

A receiving apparatus is provided, comprising an input for a transport channel bit stream, a decoder DPCM-core, a combiner, a second location clipping detector, a second location substitutor, and a second location MSB corrector. Receiving apparatuses are provided wherein there is in addition a combination of a prediction mapper and a wrap-around subtractor and/or a combination of a phase-locked loop, a luminance estimator, and a shift estimator.

A short description of the above listed parts of the provided receiving apparatuses is given below. A more extended description of these listed parts is given in the description of the first embodiment of the present invention.

In the decoder DPCM-core, the N–C bits of a sample of the compressed transport stream are decompressed to N most significant bits of an output sample. In the combiner, the M–N least significant bits and N most significant bits of a sample are combined to an output sample. In the second location clipping detector, a second location PCM-bit substitution control signal is generated, indicating what is to be selected as M–N least significant bits of the output sample, as well as a sign signal, being the sign bit of the clipping error. The second location substitutor switches between the received M–N least significant bits from the residual bit stream and a fixed replacement according to the second location PCM-bit substitution control signal. The second location MSB corrector adds to or subtracts from the sum of prediction and received clipped prediction error, the output value of mapping by means of a second function of the received residual transport sample, according to the second location PCM-bit substitution control signal and the sign signal.

Other transmitting and receiving apparatuses are provided which are built up with only some of the parts used in the above described provided apparatuses and with equivalent mutual interconnections, however, offering a lower grade compression and/or transport and/or decompression of a digital signal, a digitized television signal in particular. One transmitting apparatus according to this invention includes at least an encoder DPCM core, an output for the transport channel bit-stream, a prediction mapper, and a wrap-around adder, the corresponding receiving apparatus also being provided and including at least an input for the transport channel bit-stream, a decoder DPCM-core, a prediction mapper and a wrap-around subtractor.

Another transmitting apparatus provided by this invention includes at least an encoder CPCM core, an output for the transport channel bit-stream, a phase-locked loop, a luminance estimator and a shift estimator, the corresponding receiving apparatus also being provided and including at least an input for the transport channel bit-stream, a decoder CPCM-core, a phase-locked loop, a luminance estimator and shift estimator.

Still another transmitting apparatus according to this invention includes at least an encoder DPCM core, an output for the transport channel bit-stream, a prediction mapper, a wrap-around adder, a phase-locked loop, a luminance estimator and a shift estimator, the corresponding receiving apparatus also being provided and include at least an input for the transport channel bit-stream, a decoder DPCM-core, a prediction mapper, a wrap-around subtractor, a phase-locked loop, a luminance estimator and a shift estimator.

BRIEF DESCRIPTION OF THE DRAWINGS

The invention will now be described by means of the embodiments represented in the draws.

In the drawings.

In the drawings, same elements are represented by the same references.

ENABLING DESCRIPTION OF PREFERRED EMBODIMENTS

First Preferred Embodiment

Figure 1:
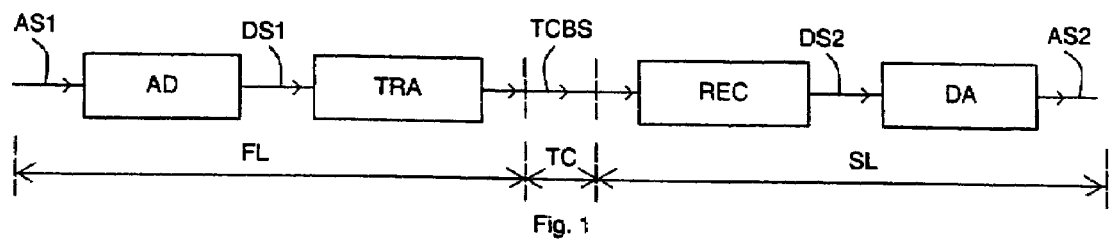
FIG. 1 shows a block diagram illustrating the transport of a digital signal from a first location over a transport channel to a second location.

FIG. 1 shows a first embodiment of the present invention which is a method for the transport of a first digitized television IF signal DS1 over a transport channel TC from a first location FL to a second location SL, where it is received as a second digitized television IF signal DS2. The bit-rate of the digitized television IF signal DS1 is fitted in the available channel bit rate, according to the present invention. The first digitized television IF signal DS1 is a modulated television signal at an IF according to one of the existing transmission standards as mentioned in ITU-R Recommendation 470-2, "Television Systems", 1986, and modulated at an IF carrier frequency.

At the first location FL, the first digitized television IF signal DS1 is transformed in a transmitter TRA into a transport channel bit-stream TCBS. The transport channel bit-stream TCBS is transmitted over the transport channel TC from the first location FL to the second location SL. At the second location SL, the received transport channel bit-stream TCBS is transformed in a receiver REC into a second digitized television IF signal DS2.

The first digitized television IF signal DS1 may optionally be the output of an analog-to-digital converter AD with a first analog television IF signal AS1 at its input. The second digitized television IF signal DS2 may optionally be the input of a digital-to-analog converter DA with a second analog television IF signal AS2 at its output.

As it is an aim of the invention to keep the visible and audible distortions to a minimum when reproducing the transported digitized television IF signal, the second digitized IF signal DS2 should be substantially equal to the first digitized television IF signal DS1.

For the first embodiment, a television IF signal according to the NTSC M standard is considered. The IF frequency is 45.75 MHz. The first digitized television IF signal DS1 is sampled at a sampling rate of 16.2 MHz with 11 bits per sample. The clock that indicates the sampling time points is called the "sampling clock". The bit rate of the first digitized television IF signal DS1 is 16.2*11 or 178.2 Mbits/s. Over the transport channel TC (e.g. SONET OC-3 or SDH STM-1), signal transport with a payload bit-rate up to 149.76 Mbits/s is available.

Figure 2:
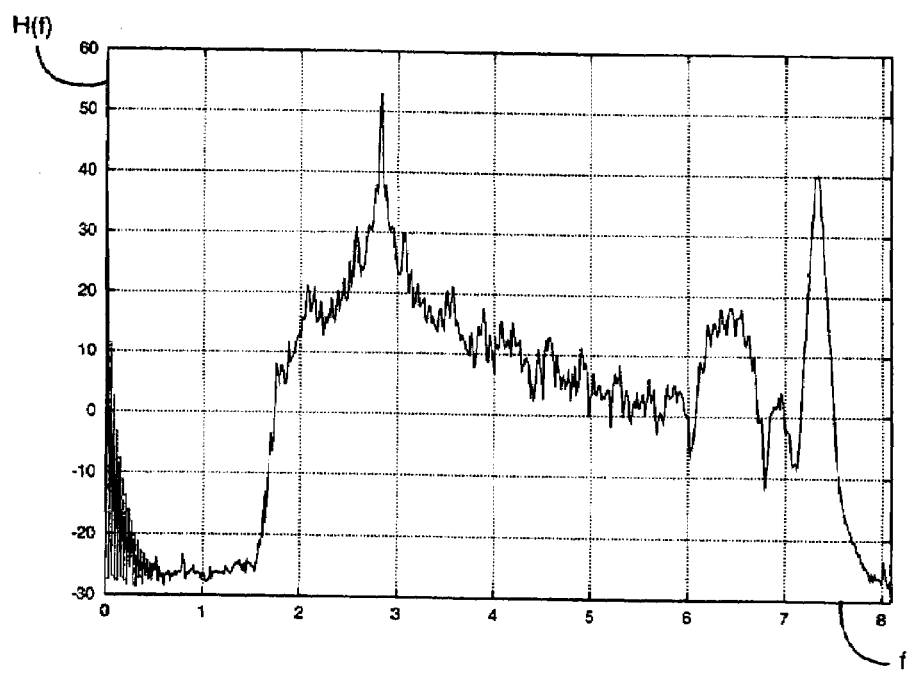
FIG. 2 shows a typical spectrum H(f) of a digitized television IF signal.

FIG. 2 shows a typical spectrum of a digitized television IF signal, whereby a NTSC M baseband television signal is modulated to an IF carrier with a frequency of 45.75 MHz, sampled at 16.2 MHz. The horizontal axis f is a frequency scale between 0 MHz and 8.1 MHz, and the vertical axis H(f) is an amplitude scale between −50 dB and +60 dB.

Figure 3:
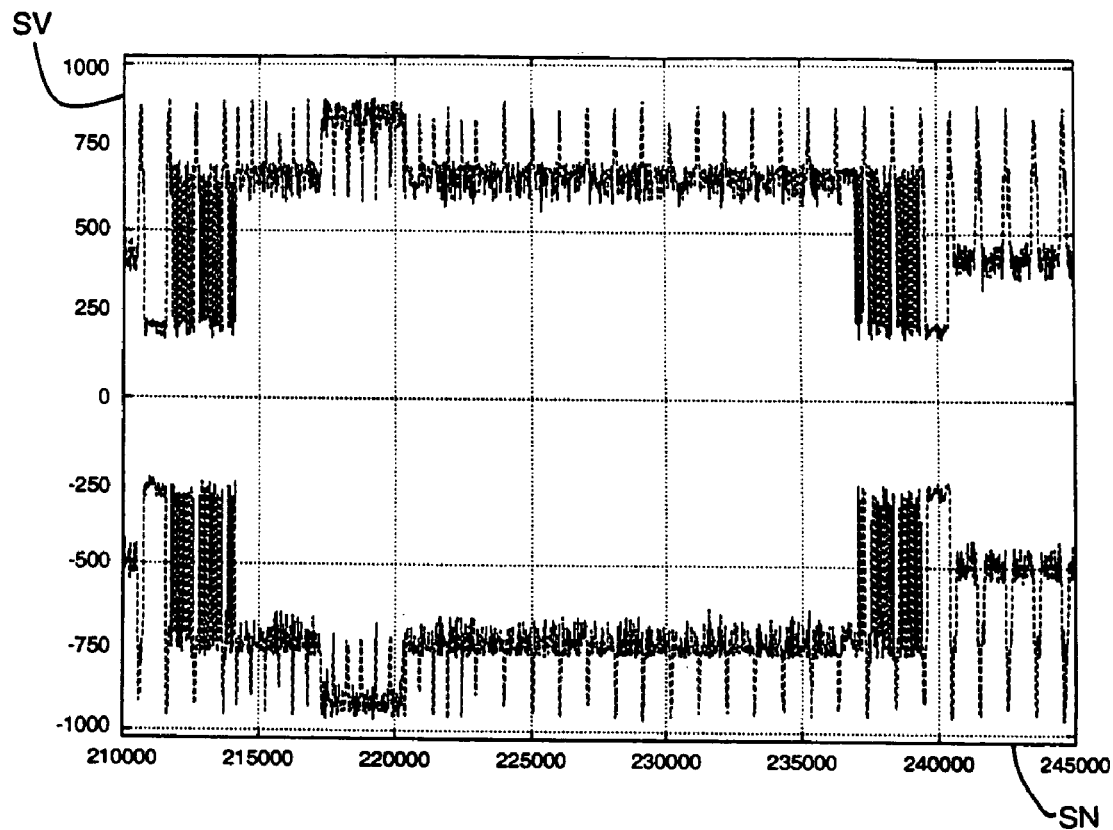
FIG. 3 shows a sampled television IF signal with negative modulation during an interval located around a vertical synchronization pulse. For clarity, only the envelope of the maximum values and the envelope of the minimum values are show, i.e., the maximum and minimum values in a sliding widow of 25 samples.
Figure 4:
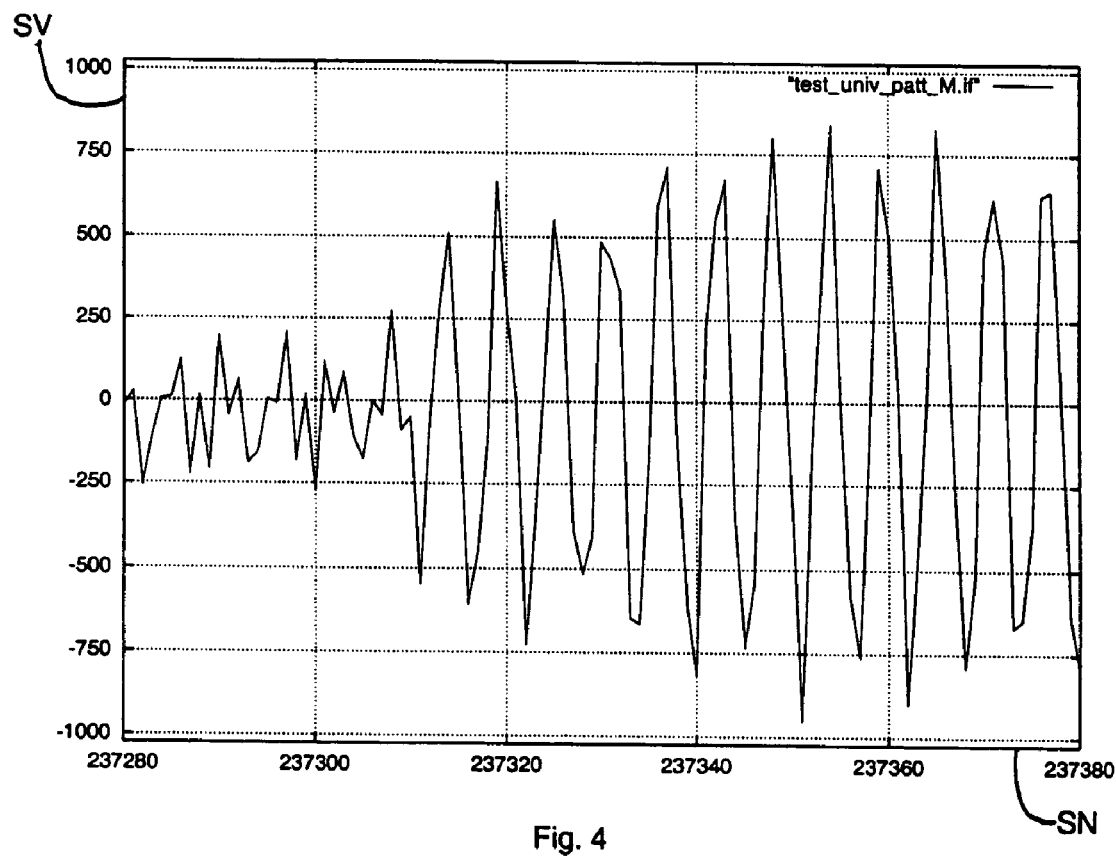
FIG. 4 shows a detail of FIG. 3 for the samples numbered from 237280 to 237380. Illustrating sampled television IF signal with negative modulation at a transition from a high to a low modulating luminance.

FIG. 3 shows a sampled television IF signal during an interval located around a vertical synchronization pulse, the sampling frequency being 16.2 MHz. The horizontal axis SN (sample number) is a time scale with numbers of consecutive samples from 210000 to 245000 as units, and the vertical axis SV (sample value) is an amplitude scale representing the amplitude of the samples of the sampled television IF signal after sampling with 11 bits per sample. Due to the negative modulation, an amplitude peak which corresponds to a horizontal sync pulse is visible approximately every 1000 samples. FIG. 4 shows a detail of FIG. 3 for the samples numbered from 237280 to 237380, illustrating the sampled television IF signal at a transition from a high to a low modulating luminance.

The above mentioned parameters of the first digitized television IF signal DS1 to be transported (NTSC M as transmission standard, 45.75 MHz as IF carrier frequency, 16.2 MHz as sampling rate, 11 bits per sample), and the above mentioned specifications of the transport channel are choices made to describe this first embodiment of the present invention. Other typical parameters and specifications known to a person skilled in the art can easily replace them. The intention is to cover all modifications, equivalents and alternatives falling within the spirit of the present invention.

Figure 5:
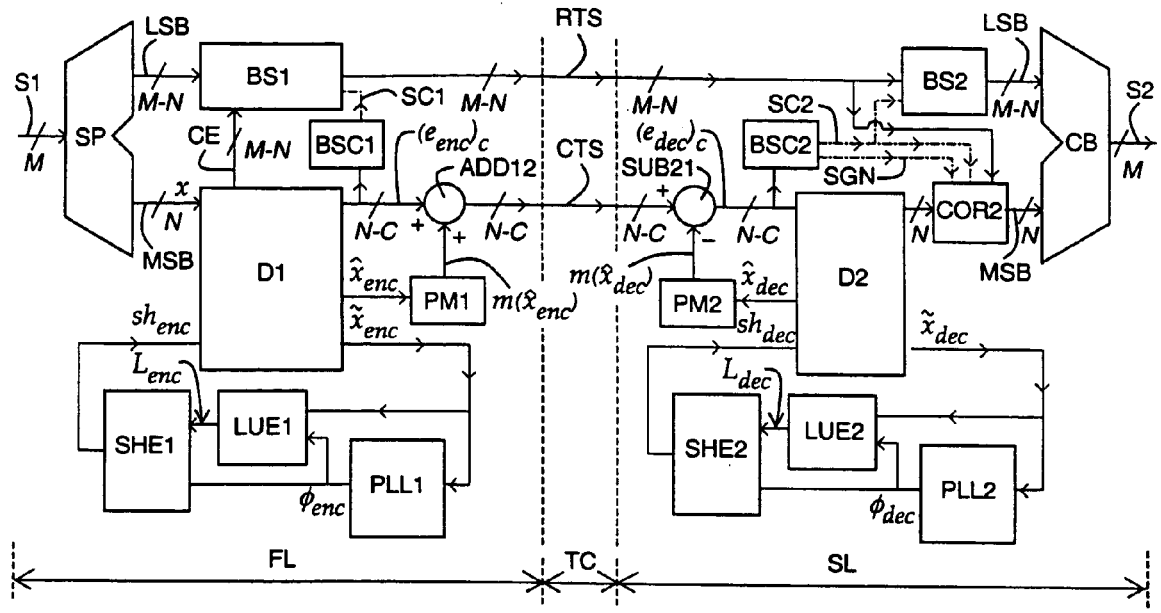
FIG. 5 shows a block diagram illustrating the compression, transport and decompression of a digital signal according to a first embodiment of the present invention.

FIG. 5 shows a block diagram of a full implementation of the first embodiment of the present invention. The description of this embodiment is broken down into smaller sections and is built up step-by-step, whereby the sections of the description correspond to parts wherein this embodiment and the method of the invention can be subdivided, and is referred to additional figures. As will be seen from the description below, the consecutively described parts of this embodiment and their interconnections from an elementary implementation to a full implementation correspond to a gradually improving method for obtaining the aims of the invention. The parts of this embodiment are therefore named "elementary implementation" and "improving parts". Some of these improving parts can operate independent from other improving parts. Consequently, a previously described improving part is not necessarily needed for the operation of an improving part described further. Some of the improving parts contain one or more improvements themselves (or extra-improving parts) which are also introduced step-by-step, and/or one or more divisional parts which draw up the improving part.

For the sake of clarity, an overview is given here of how the description of this first embodiment of the invention is built-up. After a description of the "elementary implementation", "HDPCM" is described as a first improving part. The description of HDPCM includes a description of HDPCM itself followed by descriptions of two HDPCM extra-improving parts for HDPCM, namely "reduction of the clip range" and "non-uniform mapping". Then follows the description of a second improving part named "PCM-bit substitution" which is not subdivided. Then follows a description of a third improving part named "Dynamic clip range shifting" comprising three divisions which are, after an introduction, described consecutively and which are named "IF carrier estimation", "luminance estimation" and "shift calculation". The description of the shift calculation comprises the description of a further improvement called "dejitter", and an extra-improving part to the combination of dynamic clip range shifting and HDPCM.

FIG. 5 shows the path of a sample S1 of the first digitized television IF signal from the first location FL, where it has been transformed in a sample of the transport channel bit stream, over the transport channel TC to the second location SL, where it is transformed into a sample S2 of the second digitized television IF signal. When the description of this embodiment mentions from here on a sample, it means the sample S1 or a transformed version of that same sample S1.

The parts on the left side of FIG. 5 belong to the first location FL and correspond to the transmitter TRA in FIG. 1. The parts on the right side of FIG. 5 belong to the second location SL and correspond to the receiver REC in FIG. 1.

Figure 6:
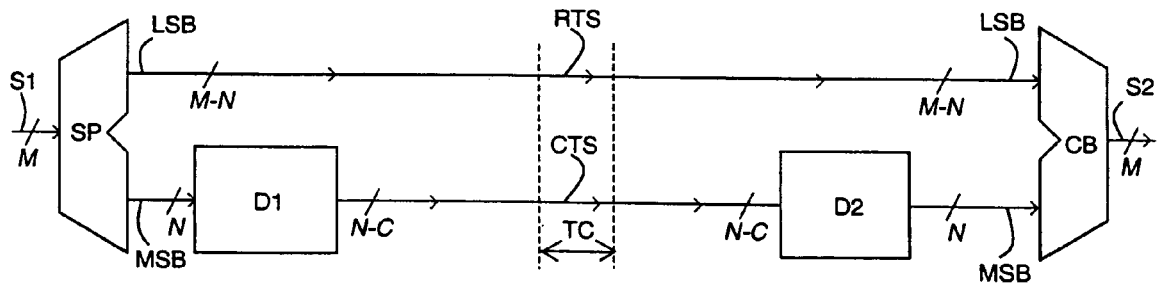
FIG. 6 shows a block diagram illustrating an elementary but not complete implementation of the first, second and third embodiments of the present invention, whereby DPCM is implemented for transport of the N most significant bits.

FIG. 6 shows the elementary implementation of this embodiment, omitting all improving parts described later.

A sample S1 of the first digitized television IF signal, having a bit-resolution of M bits (11 in this embodiment), is first split at the first location FL with a splitter SP into N MSB's (Most Significant Bits) and M−N LSB's (Least Significant Bits). The value N is by preference 8, and M−N is consequently 3. On FIG. 5, FIG. 6 and other figures, the bit resolution of signals passing through some of the interconnections is marked by means of a slash and the bit-resolution (e.g. "/M", "/N" or "/N−C")

The M−N LSB's, having usually a noisy character, are difficult to compress and are therefore, as far as they are not replaced by other bits (see below), by preference transmitted uncompressed in PCM (Pulse Code Modulated). Therefore they are further also called "PCM-bits".

The N MSB's are compressed to N−C bits in a further described encoder DPCM-core D1 using DPCM (Differential Pulse Code Modulation) and transmitted as an N−C-bit word. Therefore, the said N MSB's are sometimes called "DPCM-bits", whereas the bits of the N−C-bit word are sometimes called the "compressed DPCM-bits". In this embodiment, C is chosen to be 2, N−C consequently being 6. However, any other choice may be made for C.

The transport channel bit-stream TCBS of FIG. 1 thus consists of a compressed bit-stream (of compressed DPCM-bits) and a residual bit-stream (of PCM-bits). In FIGS. 5 and 6, the compressed bit-stream is represented by a compressed transport sample CTS, and the residual bit-stream is represented by a residual transport sample RTS, both being transformed versions of a part of the sample S1.

At the second location SL, the N−C bits of a received N−C-bit word are decompressed to N MSB's in a decoder DPCM-core D2 described below. The N decompressed MSB's are combined in a combiner CB with the received corresponding M−N LSB's of the same sample, as far as these LSB's have not been replaced by other bits (see below), to form an M-bits sample S2 of the second television IF signal.

The split of the M-bit samples S1 of the first digitized television IF signal into two parts has the advantage that the width of the DPCM-loop can be smaller than M bits (smaller than 11 bits for this embodiment), which reduces the complexity of the hardware for the compression and which permits a sufficiently fast operation of the DPCM-loop.

The DPCM part of this embodiment, consisting of two DPCM-cores, being an encoder DPCM-core D1 in an encoder at the first location FL and a decoder DPCM-core D2 in a decoder at the second location SL, is now further explained. By the encoder is meant the part of the transmitter where the DPCM-bits of a sample S1 are transformed or encoded to a compressed transport sample CTS, the encoder DPCM-core D1 being a part or the whole of it. By the decoder is meant the part of the receiver where a received compressed transport sample CTS is transformed or decoded to DPCM-bits of a sample S2, the decoder DPCM-core D2 thus being a part or the whole of it.

Figure 7:
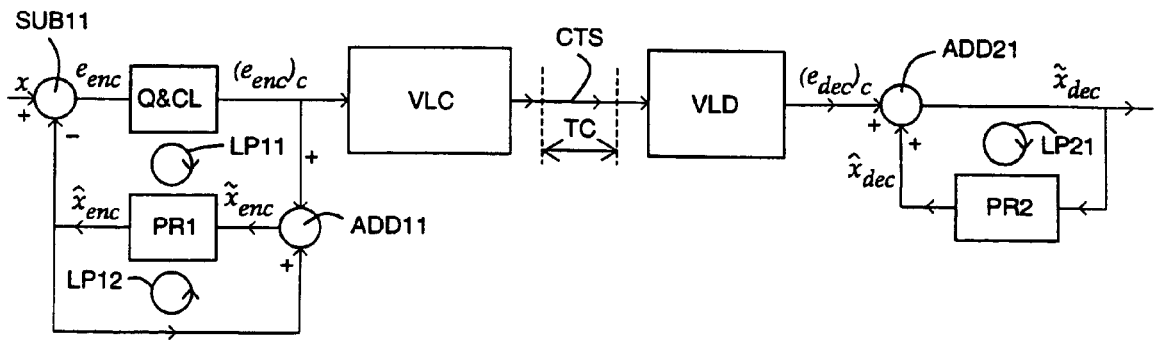
FIG. 7 shows a block diagram illustrating a prior art method for compression, transport and decompression of a digital signal using DPCM.

FIG. 7 shows a prior art DPCM configuration for transmitting and receiving a digital signal. A sample x of the digital signal to be transported over a transport channel TC is encoded before being transmitted as a compressed transport sample CTS making use of a predictor PR1, a quantizer and clipper Q&CL, an adder ADD11, a subtractor SUB11 and a variable length coder VLC, together forming an encoder. The received transport sample CTS is decoded to become a reconstructed sample $\tilde{x}_{dec}$ of the digital signal to be transported, making use of a variable length decoder VLD, a predictor PR2 and an adder ADD21, together forming a decoder.

In both encoder and decoder, the same prediction is made from previously transmitted and decoded samples of the digital signal to be transported.

The encoder contains two recursive loops LP11 and LP12, whereas the decoder contains only one recursive loop LP21. The loop LP21 corresponds to loop LP12, and therefore, LP12 is called the "local decoder in the encoder".

In the encoder of the prior art DPCM configuration, a prediction $\hat{x}_{enc}$ of a sample x, made by the predictor PR1 from the previously locally decoded samples $\tilde{x}_{enc}$, is subtracted in SUB11 from the sample x, resulting in a prediction error $e_{enc}$. The prediction error $e_{enc}$ is quantized and/or clipped in the quantizer and clipper Q&CL to become a clipped prediction error $(e_{enc})_c$. This quantizing and/or clipping is carried out in order to limit the number of possible code words to be transmitted. The clipped prediction error $(e_{enc})_c$ is added in ADD11 to the prediction $\hat{x}_{enc}$, resulting in a reconstructed input sample $\tilde{x}_{enc}$ (being a locally decoded sample in the encoder), which is the input of the predictor PR1 for making a prediction of future samples.

The quantized and clipped prediction error $(e_{enc})_c$ is input to the optional variable length coder VLC of which the output is the compressed transport sample CTS. As prediction errors usually have a histogram that is centered around zero, variable-length coding can significantly reduce the bit-rate of the prediction errors.

In the decoder of the prior art DPCM configuration, the received compressed transport sample CTS is applied to an optional variable length decoder VLD of which the output is a clipped prediction error $(e_{dec})_c$ of the decoder. The clipped prediction error $(e_{dec})_c$ is applied to a recursive decoder loop LP21 formed by the adder ADD21 and the predictor PR2. The prediction error $(e_{dec})_c$ is added in ADD21 to a prediction $\hat{x}_{dec}$ made by the predictor PR2 from the previously decoded sample, resulting in the reconstructed sample $\tilde{x}_{dec}$.

If there are no transmission errors and when the encoder and decoder start synchronously, the outputs of both loops LP12 and LP21, respectively $\tilde{x}_{enc}$ and $\tilde{x}_{dec}$ are equal.

Figure 8:
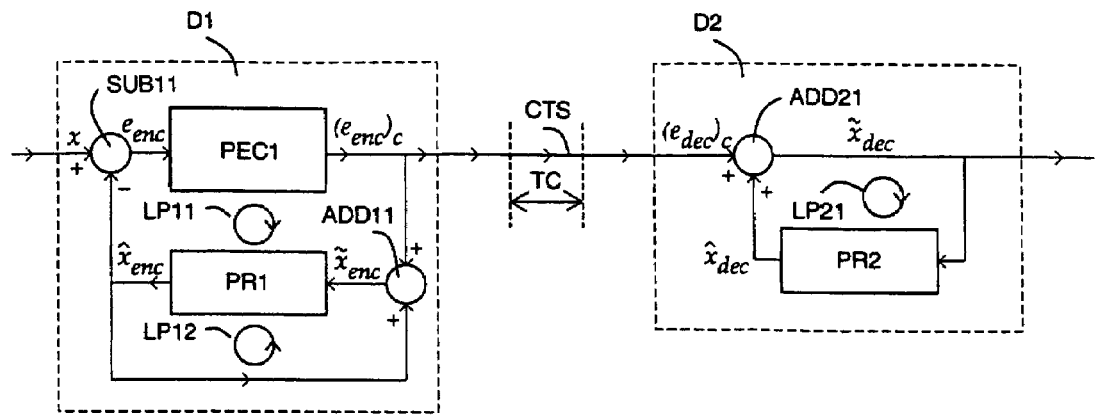
FIG. 8 shows a block diagram illustrating a DPCM encoder core and decoder core of the present invention as implemented in the embodiments.

FIG. 8 shows the DPCM part of the first embodiment of the present invention, being an adapted version of the prior art DPCM configuration shown in FIG. 7. In order to limit the complexity of the implementation, by preference no variable length coding is implemented. With variable-length coding, a difficult word synchronization has to be implemented using synchronization words, a bit-rate and buffer control, stuffing and an exception handling for cases of buffer overflow. If no variable length coding is implemented, the clipped and quantized prediction errors are coded with words of fixed length.

A prediction error $e_{enc}$ is only clipped; therefore the quantizer and clipper Q&CL is replaced by a prediction error clipper PEC1. Quantization is in this preferred embodiment not implemented because it is an aim of the invention to have a lossless or near lossless compression.

Due to the fixed length coding, the number of available code words in the codebook is limited. Therefore, in the encoder the prediction errors $e_{enc}$ are clipped to a range [A . . . B], further also called the clip range. A and B are integers with $B-A+1 \leq 2^{(N-C)}$, which allows a (N–C)-bit code word for every possible value of the clipped prediction error.

For this embodiment, N–C is 6 bits. The preferred range of prediction errors for this embodiment is [–32 . . . +31]. However, for reasons explained below, the range of prediction errors will be reduced by preference to [–31 . . . +30]. In some cases, the clip range will be shifted over an amount "sh" to the range [A+sh . . . B+sh], with sh varying from sample to sample as will be described below.

A preferred kernel for compression of digitized television IF-signals of this embodiment is a DPCM-loop using an 8-tap linear prediction (LPC). The coefficients of the linear prediction are optimized for the statistical characteristics of a representative number of television IF signals.

Figure 9:
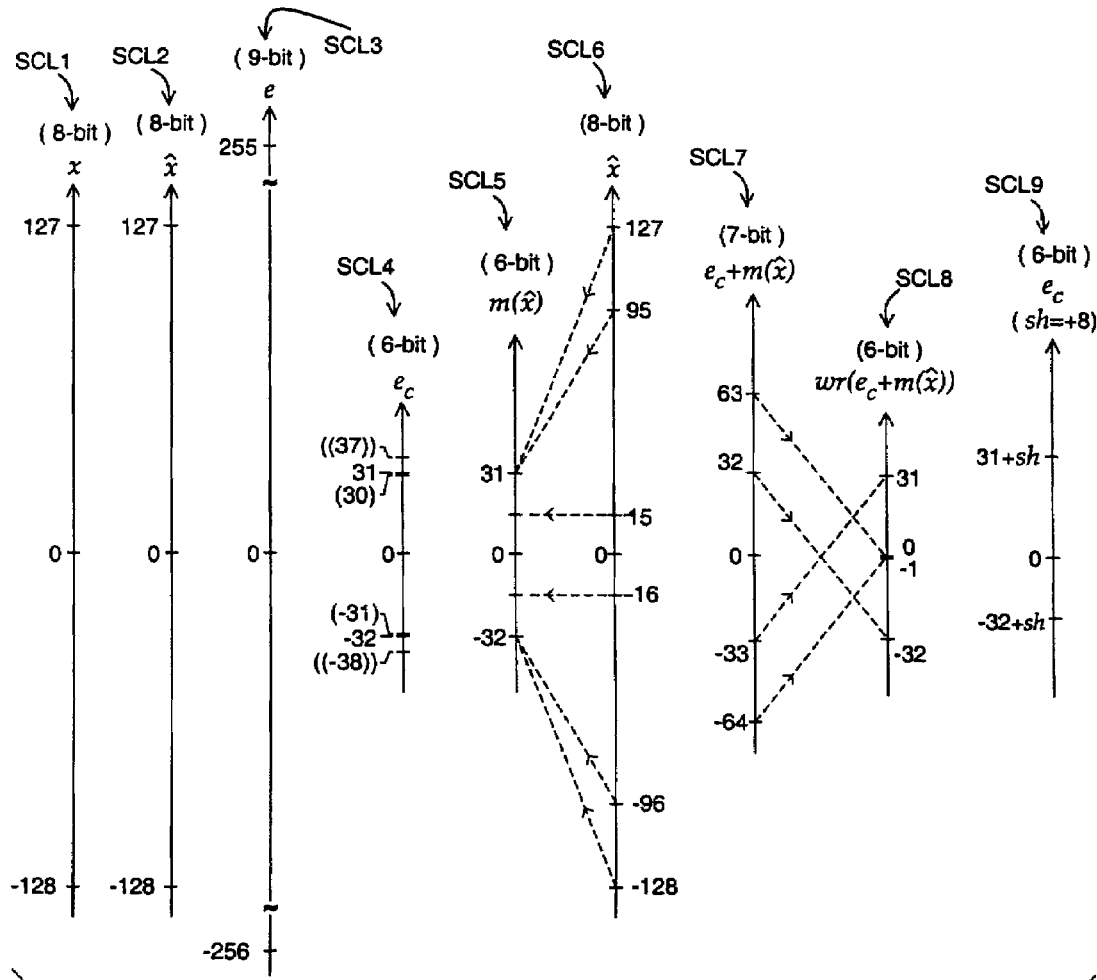
FIG. 9 shows a number of scales illustrating ranges of signals that are present in the embodiments of the present invention.

FIG. 9 shows a number of scales illustrating the ranges of signals which are present in this embodiment of the present invention for which N equals 8 and C equals 2. Scale SCL1 is for the N MSB's x, scales SCL2 and SCL6 for the predictions $\hat{x}$, scale SCL3 for the not clipped prediction errors e, and scale SCL4 for the clipped prediction errors ec; on top of each scale, the bit-resolution is mentioned. The scales SCL5, SCL7, SCL8 and SCL9 are described below.

First Improving Part, Named "HDPCM"

Figure 10:
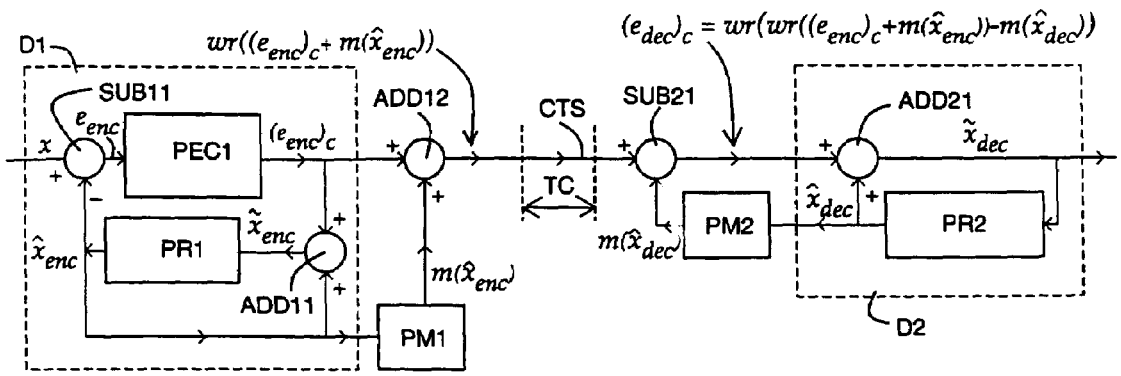
FIG. 10 shows a block diagram illustrating HDPCM (Hybrid Differential Pulse Code Modulation) as implemented in the first and second embodiments.

In order to improve the transport of samples, or more specifically, to improve the robustness against transmission errors, and to allow a random access of the decoder to the transported bit-stream of compressed data so that the decoder can start decoding at any time after start-up of the encoder without waiting for start codes, the above described encoder and decoder are by preference extended to Hybrid Differential Pulse Code Modulation or HDPCM. This HDPCM is an improving part. HDPCM is described in IEEE Transactions on Communication Technology, Vol. COM-26, No. 3, pp. 362–368, March 1978, Van Buul, "Hybrid DPCM, a combination of PCM and DPCM". FIG. 10 shows the extension of the above described encoder and decoder DPCM-cores D1 and D2 with prediction mappers PM1 and PM2 respectively, in order to obtain HDPCM. With HDPCM, both the encoder and the decoder map their predictions on a value using the same prediction mapping. In a mapping, each possible input value has one corresponding output value. This mapping can be considered as a quantization of the prediction. This mapping preserves the ordering of the prediction values. This means that when the encoder prediction $\hat{x}_{enc}$ is higher than the decoder prediction $\hat{x}_{dec}$, because of a previous transmission error or because of a random access of the decoder, the mapped value of the encoder prediction $m(\hat{x}_{enc})$ is also higher than or equal to the mapped value of the decoder prediction $m(\hat{x}_{dec})$:

if $\hat{x}_{enc} > \hat{x}_{dec}$, then $m(\hat{x}_{enc}) \geq m(\hat{x}_{dec})$.

The range of the mapping output is [D ... E] with D and E being integers and E−D being equal to or less than $2^{(N-C)}-1$. For this embodiment with N−C=6, [D ... E] is by preference [−32 ... +31].

For a given sample in a HDPCM coding system, it is not the prediction error that is transmitted, but the sum of the clipped prediction error $(e_{enc})_c$ and the mapped encoder prediction $m(\hat{x}_{enc})$. In the block diagram of HDPCM in FIG. 10, the adder ADD12 in the encoder makes the sum of $(e_{enc})_c$ and $m(\hat{x}_{enc})$. At the receiver, the mapped prediction of the decoder $m(\hat{x}_{dec})$ is then subtracted from the received sum of prediction error and mapped encoder prediction, resulting in a decoder output $(e_{dec})_c$ of the received sample (subtractor SUB21 in the decoder in FIG. 10).

For the above addition and subtraction of prediction error and mapped prediction, the results are wrapped-around. In the present embodiment with N−C or 6 DPCM bits, this wrap-around is a kind of modulo-operation which is mathematically described by the following equations, where "mod" means the modulo operation and where y is an integer number:

$$wr(y)=((y+2^{(6-1)}) \bmod 2^6)-2^{(6-1)}$$

or $$wr(y)=((y+32) \bmod 64)-32$$

Consequently, wr(+32)=−32, wr(+33)=−31, and so on, and wr(−33)=+31, wr(−34)=+30, and so on.

In FIG. 9, scale SCL5 illustrates the range of the mapped predictions $m(\hat{x})$, scale SCL7 the range of the sums of a clipped prediction error $e_c$ and a mapped prediction $m(\hat{x})$, and scale SCL8 the range of the wrapped around sums of a clipped prediction error $e_c$ and a mapped prediction $m(\hat{x})$; on top of each scale, the bit-resolution is mentioned. The wrap-around is illustrated by means of dashed lines between the scales SCL7 and SCL8.

Because of the wrap-around, the number of possible code words remains the same for HDPCM as for DPCM. For this described embodiment with N−C or 6 DPCM-bits, the number of code words for DPCM or HDPCM is $2^{(N-C)}$ or $2^6$ or 64.

The clipped prediction error $(e_{dec})_c$ which is the input to the DPCM decoder (see FIG. 10) is given by:

$$(e_{dec})_c = wr(wr((e_{enc})_c + m(\hat{x}_{enc})) - m(\hat{x}_{dec}))$$

Because of the nature of the wrap-around, this can be simplified to:

$$(e_{dec})_c = wr((e_{enc})_c + m(\hat{x}_{enc}) - m(\hat{x}_{dec}))$$

When encoder and decoder have the same prediction for a given sample, i.e, $\hat{x}_{dec} = \hat{x}_{enc}$, the mapped decoder prediction $m(\hat{x}_{dec})$ is equal to the mapped encoder prediction $m(\hat{x}_{enc})$, and thus $(e_{dec})_c = (e_{enc})_c$.

When encoder and decoder don't have the same prediction, and if $$-32 \leq (e_{enc})_c + m(\hat{x}_{enc}) - m(\hat{x}_{dec}) \leq +31$$

then $$(e_{dec})_c = (e_{enc})_c + m(\hat{x}_{enc}) - m(\hat{x}_{dec})$$

In this case, which happens almost all the time, it is as if the wrap-around in the decoder neutralizes the wrap-around in the encoder.

So, if the prediction $\hat{x}_{dec}$ in the decoder is smaller than the prediction $\hat{x}_{enc}$ in the encoder because of a transmission error in a previous sample or a random access, the clipped prediction error $(e_{dec})_c$ in the decoder will be higher than or equal to the clipped prediction error $(e_{enc})_c$ in the encoder. If the clipped prediction error $(e_{dec})_c$ in the decoder is higher than the clipped prediction error $(e_{enc})_c$ in the encoder, the too low prediction $\hat{x}_{dec}$ of the decoder will be corrected. Indeed, $\hat{x}_{dec} + (e_{dec})_c$, which is the decoder output, will deviate less from $\hat{x}_{enc} + (e_{enc})_c$ than $\hat{x}_{dec}$ deviates from $\hat{x}_{enc}$.

First Extra-Improving Part to HDPCM, Named "Reduction of the Clip Range"

When encoder and decoder don't have the same prediction, and if $$(e_{enc})_c + m(\hat{x}_{enc}) - m(\hat{x}_{dec}) < -32$$

or $$+31 < (e_{enc})_c + m(\hat{x}_{enc}) - m(\hat{x}_{dec})$$

then $(e_{dec})_c = (e_{enc})_c + m(\hat{x}_{enc}) - m(\hat{x}_{dec}) + n*64$ with n being an integer not equal to zero. In this case, the combination of wrap-around in the encoder adder ADD12 and decoder subtractor SUB21 will cause a severe deviation between $(e_{dec})_c$ and $(e_{enc})_c$. This case fortunately seldom happens.

If it happens, it is usually when the difference between the predictions $\hat{x}_{enc}$ and $\hat{x}_{dec}$ of resp. encoder and decoder are small and when at the same time the absolute prediction error is near to its maximum value. A small difference between the predictions of encoder and decoder occurs usually just before the complete resynchronization of the decoder with respect to the encoder. A large prediction error occurs at sudden changes or non-stationarities of the video signal. In this embodiment with clipping to 6 bits, the extreme prediction errors are +31 and −32. If the clipped prediction error $(e_{enc})_c$ is for instance +31 and at the same instant, the mapped encoder prediction $(m(\hat{x}_{enc}))$ is +1 higher than the mapped decoder prediction $(m(\hat{x}_{dec}))$, the decoder will end up with a prediction error equal to +31+1 or +32 and this will be wrapped around to −32. So, the prediction error $(e_{dec})_c$ in the decoder has almost the same absolute value as the prediction error $(e_{enc})_c$ in the encoder, but the sign is the opposite. This looks as if there is a transmission error of 31−(−32) or +63. To avoid such large errors in the output sufficiently, the prediction error clip range is by preference reduced, in this embodiment from [−22 ... +31] to [−31 ... +30], while the adder in the HDPCM encoder and the subtractor in the HDPCM decoder keep their wrap-around for the range [−32 ... +31].

The reduction of the clip range as described above causes it instationarities in the video information only errors that are almost imperceptible. However it has the advantage that the decoder corrects much better than deviation of the decoder from the encoder after transmission errors or after a random access.

Second Extra-improving Part to HEPCM, Named "Non-uniform Mapping"

HDPCM more quickly corrects the deviation of the decoder from the encoder when the transported signal has a higher amplitude. With negative modulation, the correction happens more quickly for sync pulses than for bright image parts. If this transported image is for instance a completely white field, a transmission error typically lasts until the end of the horizontal line.

The error correcting efficiency of the applied HDPCM can be equalized between dark and bright image areas by an appropriate non-uniform mapping of the prediction. For this embodiment with fixed-length-coding and 6 DCPM-bits per sample, there are 64 different code words. So, for HDPCM the predictions have to be mapped on 64 values. It is known by practice that the prediction range is approximately [−128 . . . +127], some so-called "outliers" lying outside this range. Such a range [−128 . . . +127] could be mapped on 64 values by a division by 4. With negative modulation, a typical range of predictions corresponding to bright image parts is [−16 . . . +15]. If the HDPCM mapping would be a division by 4, only about 8 different output levels of the prediction mapping would be used in bright areas. A typical range of predictions corresponding to dark image parts is [−64 . . . +63]. With a prediction mapping which is a division by 4, about 32 different output levels of the prediction mapping would be used in dark areas. Considering that the probability that transmission errors are corrected rises for an increasing probability that mapped predictions are different in encoder and decoder, a division by 4 leads to a discrepancy of error correction between bright and dark image areas. Therefore, it is preferred to choose for this embodiment the following non-uniform mapping: one-to-one in the range [−16 . . . +15], a division by 5 in the ranges [−96 . . . −17] and [+16 . . . +95], and mapping to −32 for values less than −96 and to +31 for values higher than +95. This preferred mapping is illustrated in FIG. 9 by means of the dashed lines between the scales SCL6 and SCL5. With this non-uniform mapping, about 32 mapping levels are used in bright areas, whereas 52 levels are used in dark areas. This is a ratio of 52/32 for non-uniform mapping instead of 32/8 for a uniform mapping based on a division by 4.

The above described strong error correction for bright image parts through a non-uniform mapping is advantageous in order to obtain a sufficiently correct estimation of the IF carrier phase which is described below.

Second Improving Part, Named "PCM-BIT Substitution"

After the above description of the transport of the MSB's or DPCM-bits applying DPCM (or HDPCM), now follows a description of the transport of the LSB's or PCM-bits.

When the MSB's are coded in DPCM (or HDPCM) and the LSB's are coded in PCM, the LSB's loose their relevance when there is a coding error in the DPCM (or HDPCM) output. A coding error in this embodiment without quantization is caused by clipping the prediction error. When the prediction error has been clipped, the clipped prediction error is equal to a clipping value, so for this embodiment with 6 DPCM-bits, this is equal to −31 or +30 (or −32 or +31 when the clip range has not been reduced). When the decoder of this embodiment receives a prediction error of −31 or +30, the decoder knows without the need for overhead information that clipping has most probably happened. It is only when the unclipped prediction error was exactly −31 or +30 that no clipping has happened.

Consequently, when the transmitted clipped prediction error is +30 or −31, the PCM-bits may be substituted by the amount of the absolute clipping error. This substitution is called a PCM-bit substitution and is an improving part of the invention. With 3 (=M−N) PCM-bits available, an absolute error of up to 7 can be transported as an unsigned integer. It is not necessary to transport a sign, because the decoder knows from the transmitted clipped prediction error the sign of the clipping error. For this embodiment, the sign of the clipping error is positive when the transmitted clipped prediction is +30 (or +31 in case of an unreduced clip range), and negative when the transmitted clipped prediction is −31 (or −32 in case of an unreduced clip range).

A preferred PCM-bit substitution is as follows. If the unclipped prediction error $e_{enc}$ is in the range [+30 . . . +37], the value $e_{enc}$−30 is transmitted in PCM bits; in case of an unreduced clip range, we have respectively the range [+31 . . . +38] and the transmitted value $e_{enc}$−31. If $e_{enc}$ is in the range [−38 . . . −31], the value +31−$e_{enc}$ is transmitted as PCM-bits; in case of an unreduced clip range, we have respectively the range [−39 . . . −32] and the transmitted value 32−$e_{enc}$. If the prediction error $e_{enc}$ is larger than +37 or smaller than −38 (larger than +38 or smaller than −39 for an unreduced clip range), a value of 7 is transmitted in the PCM-bits.

This is a clipping operation that clips the absolute clipping error to the range [0 . . . 7]. The clipping of the prediction errors to the range [−31 . . . +30] in this embodiment (or [−32 . . . +31] for an unreduced clip range) is executed in a first clipper, whereas the clipping of the absolute clipping error to the range [0 . . . 7] is executed in a second clipper.

When the decoder at the second location SL receives a clipped prediction error of +30 (+31 for an unreduced clip range), it adds to the output of the DPCM decoder loop the value that is transmitted in the PCM-bits. For a received clipped prediction error of −31 (−32 for an unreduced clip range), the decoder subtracts from the output of the DPCM decoder loop the value which is transmitted in the PCM-bits.

The output of the DPCM decoder loop is $\hat{x}_{dec}+(e_{dec})_c$. The value that is transmitted in the PCM-bits in the case that PCM-bit substitution effectively took place is MAX{|e−$(e_{enc})_c$|, 7} in this embodiment with 3 PCM-bits. When the absolute clipping error is less than 8, the output of the decoder is then $$\hat{x}_{dec}+(e_{enc})_c+(e-(e_{enc})_c)$$

When there have been no transmission errors, the output is then $\hat{x}_{enc}+e$, which is exactly the value of the original sample of the first digitized television IF signal.

When the PCM-bits have been used for the transmission of the absolute clipping error (clipped in its turn to [0 . . . 7] in this embodiment), the decoder at the second location SL does not know what should be the value for the LSB's when LSB's and MSB's are combined to an output sample in the combiner. Therefore, at the second location SL, a value of preference 4 is the three-bit LSB-input of the combiner CB for a sample for which a PCM-bit substitution effectively took place. This reduces the average error in the three LSB's or PCM-bits of a sample with PCM-bit substitution, because they have approximately a uniform distribution in the range [0 . . . 7]. The output value of 4 is an arbitrary choice; a value of 3 is a good alternative.

Figure 11:
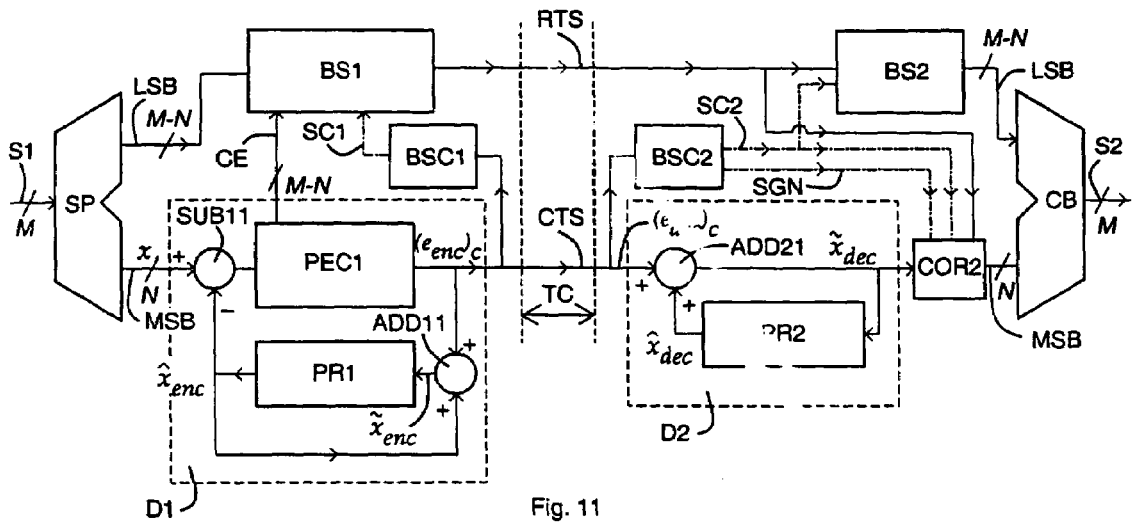
FIG. 11 shows a block diagram illustrating a partial implementation of the first embodiment of this invention, whereby DPCM is implemented for transport of the N most significant bits and PCM-bit substitution is carried out on the M–N least significant bits.

FIG. 11 shows the implementation of PCM-bit substitution. A first location PCM-bit substitution control signal SC1 controls the substitution of PCM-bits. The control signal SC1 is derived in a first location clipping detector BSC1 from the clipped prediction error $(e_{enc})_c$. The control signal SC1 is only true for $(e_{enc})_c$ equal to +30 or −31 (or +31, respectively −32 for an unreduced clip range). In substitutor BS1, the LSB's are replaced by a substitution value CE emanating from the prediction error clipper PEC1 if the control signal SC1 is true.

Figure 22:
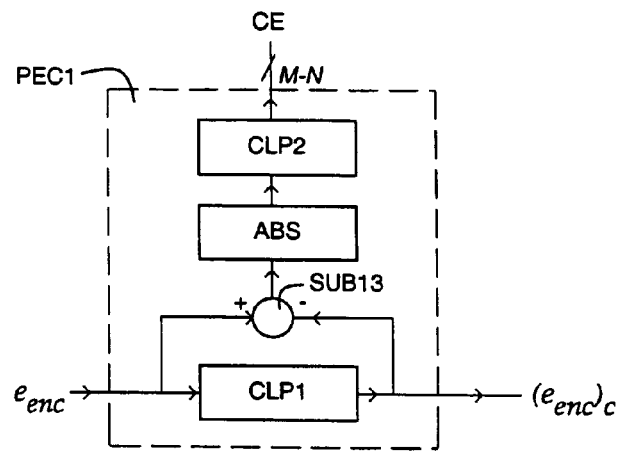
FIG. 22 shows a block diagram of a prediction error clipper (PEC1).

FIG. 22 is a block diagram of the prediction error clipper PEC1. A first clipper CLP1 clips the prediction error $e_{enc}$. A subtractor SUB13 calculates the clipping error and an absolute value calculator ABS takes the absolute value from it. A second clipper CLP2 clips the absolute clipping error to the range [0 . . . $2^{(M-N)}-1$], generating the substitution value CE, being a clipped absolute clipping error.

A second location PCM-bit substitution control signal SC2 controls an MSB corrector COR and a second location PCM-bits switch BS2. The control signal SC2 and a sign signal SGN are derived in a clipping detector BSC2 from the clipped prediction error $(e_{dec})_c$. The control signal SC2 is true for $(e_{dec})_c$ equal to +30 or −31 (+31 or −32 for an unreduced clip range). The sign signal SGN indicates a positive clipping error if $(e_{dec})_c$ is +30 and a negative clipping error if $(e_{dec})_c$ is −31 (+31, respectively −32 for an unreduced clip range).

A second location PCM-bits switch BS2 switches the M−N LSB's of a sample of the second television IF signal between the received M−N bits from the residual bit stream RTS and a fixed replacement (M−N)-bit word $2^{(N-M-1)}$, or 4 in the preferred embodiment. If control signal SC2 indicates that PCM-bit substitution has taken place and if sign signal SGN indicates a positive clipping error, the MSB corrector COR2 adds the absolute clipping error received via the residual bit stream RTS to the output $\tilde{x}_{dec}$ of the DPCM decoder core D2. Otherwise, for sign signal SGN indicating a negative clipping error in case of PCM-bit substitution, the MSB corrector COR2 subtracts the absolute clipping error received via RTS from $\tilde{x}_{dec}$. The output of the MSB corrector COR2 is applied to the combiner CB.

Figure 23:
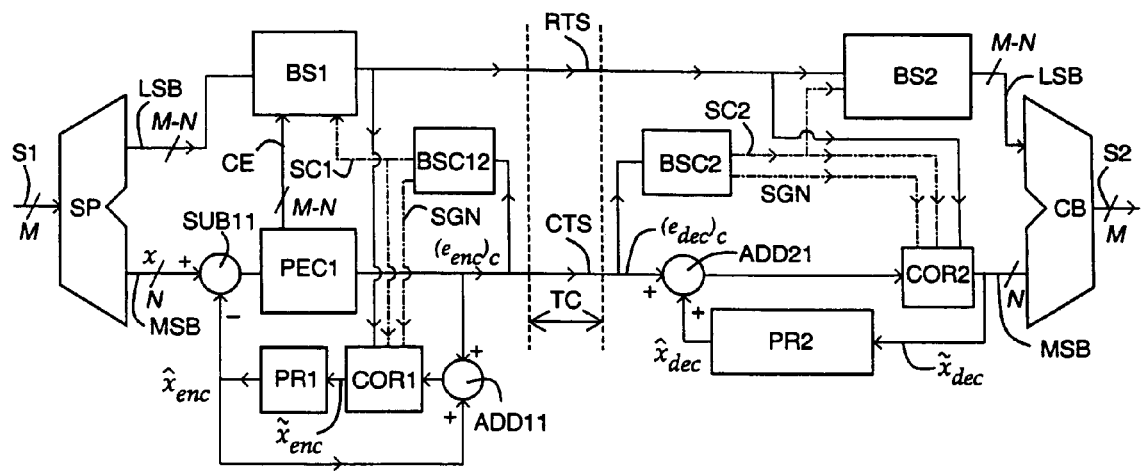
FIG. 23 shows a block diagram illustrating an alternative partial implementation of the first embodiment of this invention, whereby DPCM is implemented for transport of the N most significant bits and PCM-bit substitution is carried out on the M–N least significant bits.

Instead of the implementation of FIG. 11, the correction can be in the loop LP21 of the DPCM decoder, and, consequently, also in the loop LP12 of the local decoder in the encoder. An implementation with the correction of the PCM-bit substitution is given in FIG. 23. The output of (COR1, COR2) is fed back to the predictor (PR1, PR2) In the encoder, BSC1 is replaced by BSC12, which is exactly the same clipping detector BSC2 as in the decoder.

Figure 12:
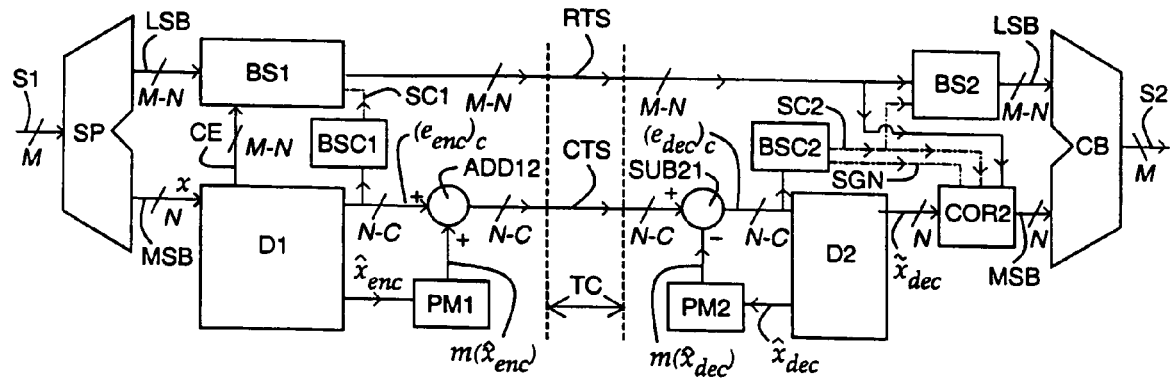
FIG. 12 shows a block diagram, illustrating a partial implementation of the first embodiment of this invention, whereby HDPCM is implemented for transport of the N most significant bits and PCM-bit substitution is carried out on the M–N least significant bits.

The second improving part, named PCM-bit substitution, has been described above referring to FIG. 11 corresponding to the case whereby DPCM is implemented. FIG. 12 shows a block diagram, illustrating a partial implementation of the first embodiment of this invention, whereby the first and second improvements are combined, HDPCM being implemented for transport of the N most significant bits and PCM-bit substitution being carried out on the M−N least significant bits.

Instead of a clipped absolute clipped error, some other substitution value (CE) which is a function of the clipping error can be used for substitution of the PCM-bits, as long as that substitution value (CE) can be represented by M−N bits. This function comes in the place of the second clipper CLP2. In this case, the decoder has to map by means of a second function the values received as residual transport sample to a value that can be added to or subtracted from the output of the DPCM decoder loop, if the control signal SC2 indicates that PCM-bit substitution has taken place. This mapping by means of a second function has to take place in the corrector COR2.

Instead of substituting all (M−N) PCM-bits, it is also possible to substitute only P least significant bits of the (M−N) PCM-bits, with P smaller than (M−N). The other (M−N−P) bits can be used to transmit the M−N−P most significant bits of the (M−N) PCM-bits. In this case, in the second clipper CLP2, the absolute clip error has to be clipped to a range [0 . . . $(2^P−1)$], or a value which is a function of the absolute clip error and which can be represented by P bits has to be calculated. In BS1 only P of the M−N PCM-bits are substituted if SC1 indicates so, and SC1 is generated by BSC1 or BSC12 as described before. In the case that PCM-bit substitution has taken place, COR1 and COR2 add or subtract the value transmitted in those P bits (if necessary derived by means of a second function) to its input, and BS2 replaces then these P bits by the value $2^{(P-1)}$ (or $2^{(P-1)}-1$).

Third Improving Part, Named "Dynamic Clip Range Shifting"

Figure 13:
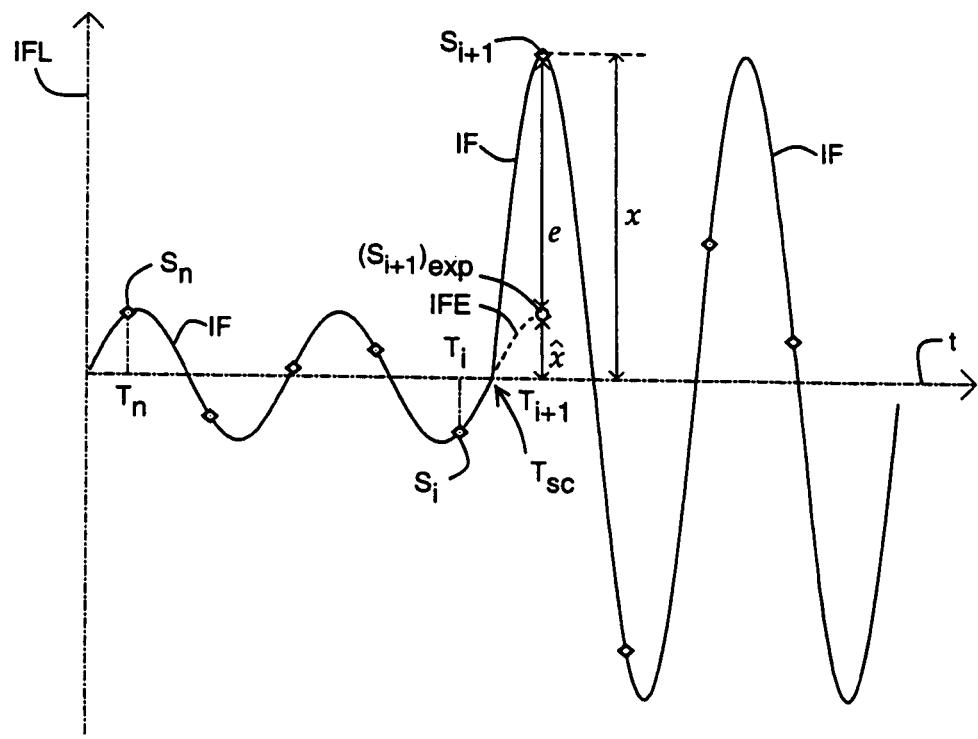
FIG. 13 shows, for a television IF signal with negative modulation, a transition from a high to a low luminance whereby the first sample after the transition coincides with a positive peak of the IF carrier.
Figure 14:
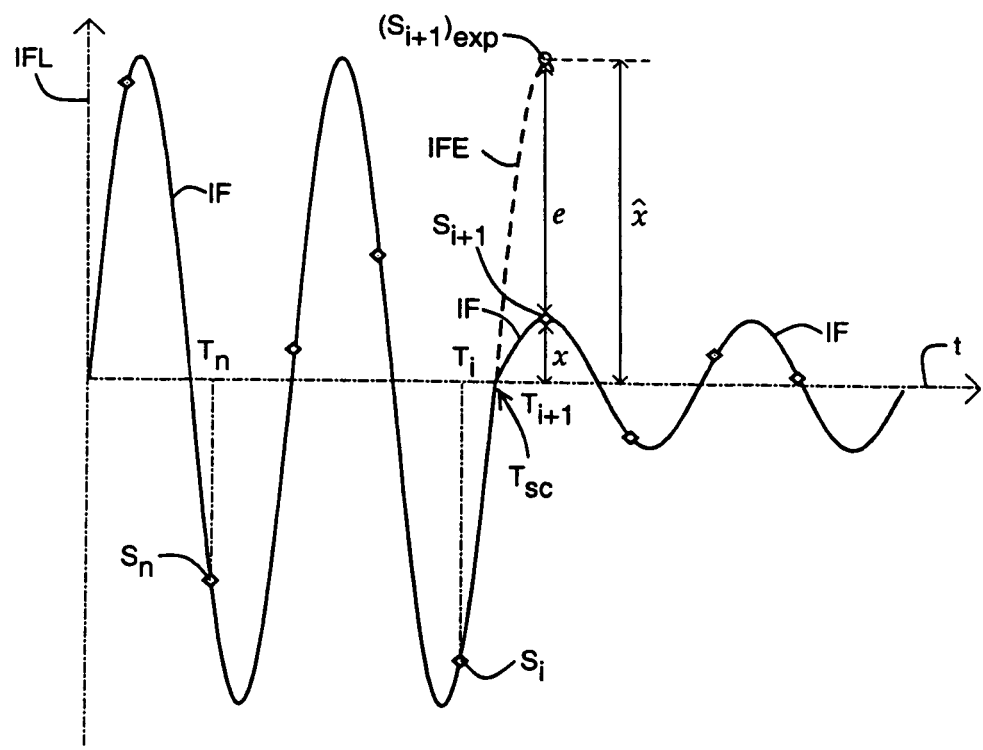
FIG. 14 shows for a television IF signal with negative modulation, a transition from a low to a high luminance whereby the first sample after the transition coincides with a positive peak of the IF carrier.

Even with PCM-bit substitution, big clipping errors can still happen at sudden changes of the sampled television IF signal. These coding errors can lead to visible or audible distortions. FIG. 13 and FIG. 14 illustrate such sudden changes of a television IF signal (marked IF). The vertical axis IFL (IF signal level) represents the amplitude of the television IF signal, and the horizontal axis (marked t) represents a time axis. FIG. 13 illustrates a television IF signal with negative modulation having at time instant $T_{sc}$ a sudden change (or transition) from a low amplitude (a bright image part) to a high amplitude (a dark image part). FIG. 14 illustrates a television IF signal with negative modulation having at time instant $T_{sc}$ a sudden change (or transition) from a high amplitude (a dark image part) to a low amplitude (a bright image part). Both FIG. 13 and FIG. 14 show samples $S_n$ of the television IF signal each corresponding to a time instant $T_n$. $S_i$, at $T_i$, is the sample taken just before, and $S_{i+1}$, at $T_{i+1}$, the first sample taken just after the sudden change at time instant $T_{sc}$. Graph IFE (with dashed lines) between $T_{sc}$ and $T_{i+1}$ represents the expected television IF signal immediately after $T_{sc}$. $(S_{i+1})_{exp}$ represents the first sample after $T_{sc}$ as it is expected. It is clear from FIG. 13 and FIG. 14 that there is a relatively big prediction error (or e) at $T_{i+1}$ between the sample $S_{i+1}$ (or x) and the expected (or predicted) sample amplitude $(S_{i+1})_{exp}$ (or $\tilde{x}$).

To avoid big clipping errors caused by sudden changes of the sampled television IF signal, an additional improvement is obtained by making the prediction error clip range not fixed but adaptive, applying a method called here dynamic clip range shifting. The said dynamic clip range shifting is related to the phase of the IF carrier and to the luminance of the television IF signal. Therefore, the IF carrier phase and the luminance are estimated in what is further called respectively an IF carrier estimation and a luminance estimation.

Figure 15:
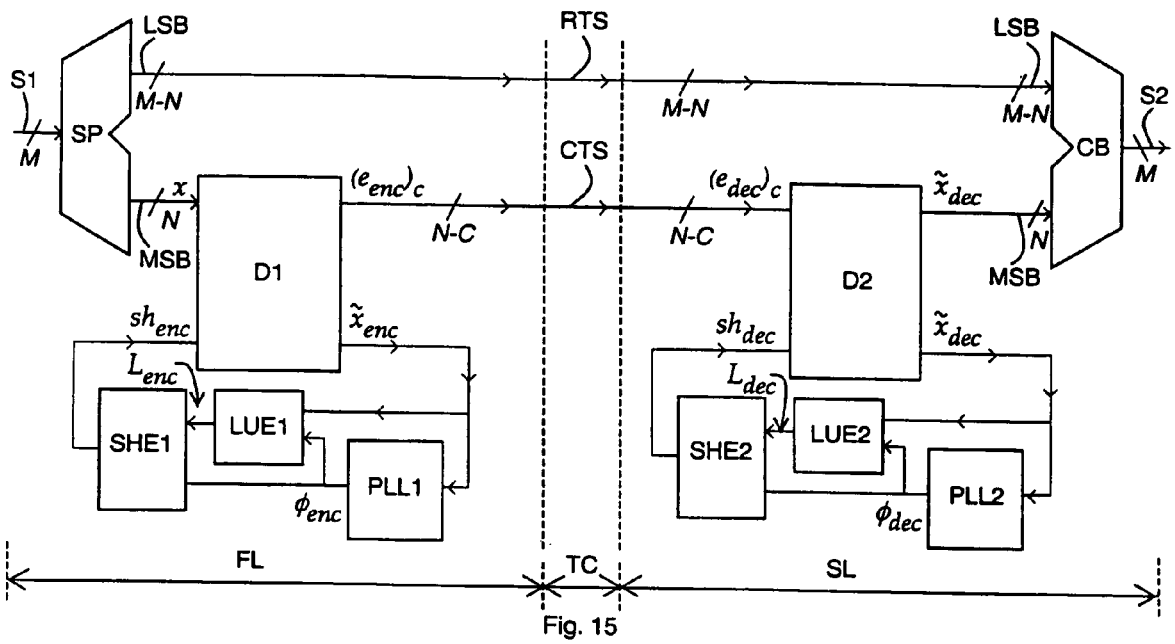
FIG. 15 shows a block diagram, illustrating the addition of a dynamic clip range shifting to the elementary implementation of the first, second and third embodiments of the present invention, the block diagram corresponding to the third embodiment of the present invention.

FIG. 15 shows the dynamic clip range shifting added to the elementary set-up, consisting of an IF carrier estimation being a phase-locked loop (PLL1, PLL2), a luminance estimator (LUE1, LUE2) and a shift estimator (SHE1, SHE2) in both the first location FL and the second location SL.

First Divisional Part of Dynamic Clip Range Shifting, Called "IF Carrier Estimation"

The dynamic clip range shifting is based on the IF carrier phase. As the IF carrier phase is unknown in the decoder, the decoder has to estimate the IF carrier phase. In order to have the same shift in encoding and decoding with a dynamic clip range shifting, the encoder has to do the same IF carrier estimation as the decoder. The IF carrier estimation is by preference realized by means of a phase-locked loop PLL1, PLL2, one in the encoder and one in the decoder. In both the encoder and the decoder, it is a decoded television IF signal $\tilde{x}$, respectively being the output $\tilde{x}_{enc}$ of the local decoder in the encoder and the output $\tilde{x}_{dec}$ of the decoder, which is the reference input of the PLL.

The PLL should estimate the phase of the IF carrier present in the decoded television IF signal. In this embodiment, the IF carrier of 45.75 MHz in the spectrum of the digitized NTSC M television signal is mirrored to a frequency of (3*16.2)−45.75=2.85 MHz because of the 16.2 MHz sampling. For other transmission standards (e.g., PAL B/G with an IF carrier frequency of 38.9 MHz), the mirrored IF carrier will have a different frequency (e.g., 6.5 MHz for PAL B/G).

Figure 16:
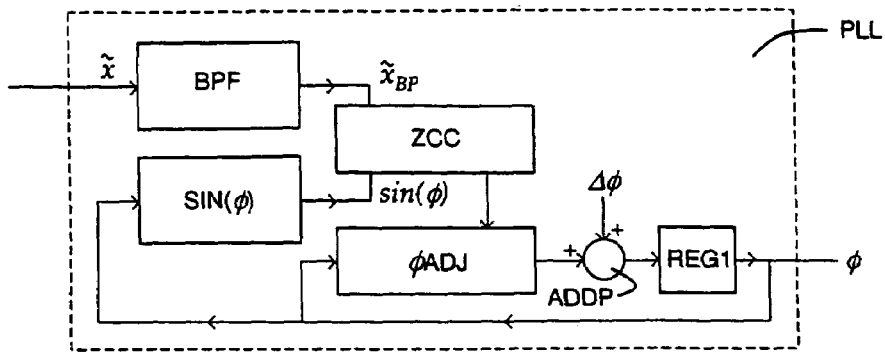
FIG. 16 shows a block diagram of an IF carrier estimation, being a phase-locked loop (PLL)

In order to reduce the complexity, by preference a simple PLL structure as illustrated in FIG. 16 is implemented, with which the zero-crossings of a signal, further referred to as the generated sine wave sin(Φ) and being generated by a sine wave generator SIN(Φ), are matched to the zero-crossings of the band-pass filtered decoded IF signal $\tilde{x}_{BP}$. The PLL phase Φ is a linear function of time t, expressed as Φ=$\omega_{IF}$t with $\omega_{IF}$ being the angular frequency of the IF carrier. By "zero-crossings" are meant points of time where a zero-mean signal passes from a positive to a negative value or vice-versa.

Because zero-crossings are time-critical for the good operation of the PLL, the decoded IF signal $\tilde{x}$ is first band-pass filtered with a band-pass filter BPF before being applied to a zero-crossing comparator ZCC in order to reduce the influence of the audio signal. On FIG. 4, it is visible in the samples 237280 to 237305 that, for this embodiment for the NTSC M transmission standard, the audio signal, which is in the spectrum centered around 2.85 MHz+4.5 MHz=7.35 MHz, resembles, referred to the 2.85 MHz IF carrier signal, a relatively noisy component which influences significantly the zero-crossings. A simple symmetrical three-taps low-pass filter with taps 1/2/1 is sufficient as band-pass filter and is therefore preferred. Such a filter not only suppresses the audio signal around 2.85 MHz+4.5 MHz=7.35 MHz in the digitized IF signal spectrum between 0 and 8.1 MHz, but also the color information around 2.85 MHz+3.58 MHz=6.43 MHz. In the case of PAL B/G, this low-pass filter has to be replaced by a high-pass filter.

The precision of the phase values in the PLL of this embodiment is by preference 8 bit, which means that the phase range of [0° . . . 360° [is to be mapped on the range [0 . . . 256[. For NTSC M, a 2.85 MHz sine wave sampled at 16.2 MHz, an increment between two consecutive samples corresponds to a phase increment ΔΦ of (256*2.85)/16.2 or approximately 45. For the phase represented by 8 bits, the fixed phase increment is ΔΦ=45 for NTSC M (it is 103 for PAL B/G). The phase values are kept within the range [0 . . . 255] through a modulo-256 operation, which in a 8-bit-adder happens automatically.

The PLL as shown in FIG. 16 is a loop which consists of a register REG1, an adder ADDP which adds every clock cycle a value ΔΦ to the PLL phase Φ, and extra logic to align the zero-crossings of the high-pass filtered decoded IF signal $\tilde{x}_{BP}$ and the locally generated sine wave sin(Φ). This extra logic includes the zero-crossing comparator ZCC and a Φ adjustment ΦADJ.

The sign bit of a sine value gives information on the zero-crossings of that sine wave. If, for a given sample, the sign of the band-pass filtered decoded IF signal $\tilde{x}_{BP}$ is equal to the sign of the generated sine wave sin(Φ), the Φ adjustment ΦADJ passes its input Φ unchanged to its output.

If, for a given sample, the sign of the band-pass filtered decoded IF-signal $\tilde{x}_{BP}$ is not equal to the sign of the generated sine wave sin(Φ), the PLL phase Φ is adjusted in ΦADJ by the minimum possible amount such that the sign of the band-pass filtered decoded IF-signal $\tilde{x}_{BP}$ and the sign of the generated sine wave sin(Φ) become the same as listed in Table 1.

TABLE 1

| Band-pass filtered decoded IF signal $\tilde{x}$ BP | sine wave sin (Φ) | PLL phase Φ | PLL phase Φ adjusted to |
|---|---|---|---|
| positive | negative | [128 . . . 191] | 127 |
| positive | negative | [192 . . . 255] | 256 modulo 256 = 0 |
| negative | positive | [0 . . . 63] | (−1) modulo 256 = 255 |
| negative | positive | [64 . . . 127] | 128 |

The phase adjustment as described here leads to fast recovery of the exact PLL phase Φ in the decoder at start-up or after a transmission error.

In this embodiment, the output of the zero-cross comparator ZCC indicates whether the signs of $\tilde{x}_{BP}$ and sin(Φ) are identical or not. The Φ-adjustment ΦADJ adjusts the PLL phase Φ according to Table 1, or passes Φ unchanged from input to output if $\tilde{x}_{BP}$ and sin(Φ) have the same sign.

The band-pass filter BPF introduces a phase shift between its output and its input and consequently also a phase shift to the output of the PLL. This phase shift by the band-pass filter BPF must be compensated when the PLL phase Φ is used for decisions on the shift of the clip range. With the here preferred three-tap band-pass filter, the shift introduced by the band-pass filter is one cycle of a sample clock, or ΔΦ units of the 8-bit-precision phase.

Second Divisional Part of Dynamic Clip Range Shifting, Called "Luminance Estimation"

As said before, the dynamic clip range shifting is not only related to the phase of the IF carrier, but also to the luminance of the composite signal that modulates the IF carrier. The luminance is however not transmitted as side information within the sampled television IF-signal and must therefore be estimated in both the encoder and the decoder. In order to have the same shift in encoding and decoding with a dynamic clip range, the encoder must have the same luminance estimation as the decoder.

A television IF signal is approximately an IF carrier which is modulated in amplitude by the luminance, and is represented here further as Y*sin($\omega_{IF}$t) whereby Y is the luminance in the case of positive modulation or the inverted luminance in the case of negative modulation, and whereby $\omega_{IF}$ is the angular frequency of the IF carrier. After sampling at 16.2 MHz, the spectrum of the modulated IF carrier is mirrored to the range [−8.1 . . . +8.1 MHz].

The luminance estimation is by preference carried out in two steps as described below.

The first step of the luminance estimation is the multiplication of $\tilde{x}_{BP2}$, the band-pass filtered output signal $\tilde{x}$ of the decoder or of the local decoder in the encoder, by an estimated IF carrier. The estimated IF carrier is derived from the PLL phase Φ, and $\tilde{x}_{BP2}$ is derived from $\tilde{x}$ by means of the band-pass filter BP2.

The output Φ of the PLL has a phase delay of one sample period with respect to the decoded IF signal $\tilde{x}$ because of the delay caused by the three-taps band-pass filter BPF in the PLL. The phase delay of one sample period can be compensated for in the luminance estimation by not multiplying sin(Φ) but sin(Φ+ΔΦ) with $\tilde{x}_{BP2}$. However, the band-pass filter BPF2 causes also a delay in the other input $\tilde{x}_{BP2}$ of the mixer. In general, sin(Φ+n*ΔΦ) with n the difference of delay in sample units between both inputs of the mixer, is an estimation for the IF carrier sin($\omega_{IF}$*t). The multiplication is then:

$\tilde{x}*\sin(\omega_{IF}*t) \approx Y*\sin(\omega_{IF}*t)*\sin(\omega_{IF}*t)=0.5*Y*(1-\cos(2\omega_{IF}*t))$ The second step of the luminance estimation is a low-pass filtering by means of a low-pass filter LPF of the result of the multiplication of the first step of the luminance estimation in order to suppress the high-frequency component $\cos(2\omega_{IF}*t)$ and to obtain the (inverted) luminance Y, being an estimated (inverted) luminance L.

The output of the mixing of the decoded IF signal $\tilde{x}$ and the sine wave $\sin(\Phi+\Delta\Phi)$ has a strong component at the double IF carrier frequency. With this embodiment for NTSC M, the said double IF carrier frequency is 2.85*2=5.7 MHz. The said low-pass filtering LPF of the second step of the luminance estimation is by preference a 5-tap filter with taps 1/1/2/1/1 for NTSC M. This filter without multipliers is preferred because of its simple realization, and because it almost completely suppresses the unwanted mixing output 5.7 MHz.

Figure 17:
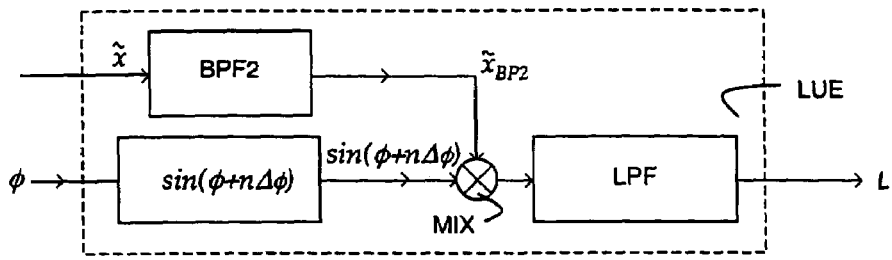
FIG. 17 shows a block diagram of a luminance estimator (LUE)

FIG. 17 shows a block diagram of the luminance estimation part (marked LUE) of this embodiment of the invention as described above, with which the estimated (inverted) luminance L is obtained from the PLL phase $\Phi$ and the decoded IF signal $\tilde{x}_{BP2}$. The said multiplication of the first step of the luminance estimation is carried out as a mixing in a mixer MIX of the band-pass filtered decoded IF signal $\tilde{x}_{BP2}$ with a local oscillator sine wave $\sin(\Phi+n*\Delta\Phi)$ from a local oscillator $SIN(\Phi+v*\Delta\Phi)$. The output of low-pass filter LPF is the estimated (inverted) luminance L.

The band-pass filter BPF2 is in this embodiment by preference the same filter as BPF. In this preferred embodiment, $\tilde{x}_{BP2}$ is equal to $\tilde{x}_{BP}$ PLL.

The band-pass filter BPF2 suppresses the audio and chrominance components because they lead to mixer products that are not sufficiently suppressed by the low-pass filter LPF.

Third Divisional Part of Dynamic Clip Range Shifting is Described now, Named "Shift Calculation"

A preferred calculation of a shift of the clip range is described, based on the IF carrier phase and luminance estimation described above.

Prediction errors can lie outside the clip range at unpredictable sudden changes or transitions of the television IF signal, of which some have been described before with the aid of FIG. 13 and FIG. 14. In the sampled television IF signal, these said sudden changes are maximal when a difficult-to-predict sample coincides with a peak of the sine wave of the IF carrier. Therefore, a shift of the clip range ([−31 . . . +30] for this embodiment with reduced clip range) must be in proportion to the instantaneous value of the sine wave of the IF carrier which is represented as $\sin(\omega_{IF}*t)$.

In order to avoid a multiplication in the calculation of the shift sh of the clip range as represented by $$sh(t) = C*\sin(\omega_{IF}*t)$$

whereby C is an arbitrary constant, the estimated IF carrier is quantized. A preferred implementation uses seven levels of quantization.

The preferred thresholds for the 7-level quantization are given in the first column of Table 2.

TABLE 2

| Instantaneous value of the IF carrier $\sin(\omega_{IF}*t)$ | shift amount at low luminance | shift amount at high luminance |
| --- | --- | --- |
| $256*\sin(\omega_{IF}*t) \leq -96$ | +12 | −12 |
| $-96 < 256*\sin(\omega_{IF}*t) \leq -80$ | +8 | −8 |
| $-80 < 256*\sin(\omega_{IF}*t) \leq -64$ | +4 | −4 |
| $-64 < 256*\sin(\omega_{IF}*t) < 64$ | 0 | 0 |
| $64 \leq 256*\sin(\omega_{IF}*t) < 80$ | −4 | +4 |
| $80 \leq 256*\sin(\omega_{IF}*t) < 96$ | −8 | +8 |
| $96 \leq 256*\sin(\omega_{IF}*t)$ | −12 | +12 |

The amount of shift of the prediction error clip range is by preference determined as follows for the case of negative modulation.

When the luminance is low, a hardly predictable transition is a transition to a high luminance. When the first sample of the IF signal after such a transition from a low to a high luminance coincides with a positive peak of the IF carrier as illustrated in FIG. 14, the prediction error will have a large negative value, for some transitions of this embodiment much less than −31. Therefore, the losslessness of the compression in case of hardly predictable luminance transitions is improved by introducing a shift sh of the before mentioned clip range of [−31 . . . +30] for samples corresponding to a dark luminance to a clip range of [(−31+sh) . . . (30+sh)] whereby sh is a negative value of by preference 0, −4, −8 or −12, corresponding respectively to the before mentioned quantization levels of the instantaneous value of the IF carrier as indicated in Table 2. When the first sample of the IF signal after such a transition from a low to a high luminance coincides with a negative peak of the IF carrier, the shift should have a positive value, for this embodiment by preference with sh values of 0, +4, +8 and +12 corresponding to the quantization levels of the quantized instantaneous value of the estimated IF carrier as indicated in Table 2. In FIG. 9, SCL9 illustrates a shift of the clip range [−32 . . . +31] for a shift sh of +8.

When the luminance is high, a hardly predictable transition is a transition to a low luminance. Similarly as with the above described transition from a low to a high luminance, coding errors are reduced by a shift sh of the clip range. When the first sample of the IF signal after such a transition from a high to a low luminance coincides with a positive peak of the IF carrier as illustrated in FIG. 13, a positive shift sh of the, clip range is needed. When the first sample of the IF signal after a transition from a high to a low luminance coincides with a negative peak of the IF carrier, a negative shift sh of the clip range is needed. Table 2 shows the preferred shift amounts for this embodiment in function of the quantized instantaneous value of the estimated IF carrier.

The shift values of Table 2 are for the case of negative modulation, as is the case for NTSC M. For negative modulation, a low luminance corresponds to high values of L, and a high luminance corresponds to low values of L. For positive modulation, the signs of the shift amount should be inverted, because for positive modulation, a low luminance corresponds to low values of L, and a high luminance corresponds to high values of L.

Improvement to the Shift Calculation, Named "Dejitter"

Practice has shown that it is preferred to add some dejitter to the thresholds of the low and high luminance values of the estimated luminance L. With this embodiment, the dejitter is obtained by taking into account both the estimated (inverted) luminance of the actual sample and the estimated luminance of the previous sample. A sample is considered to belong to a high luminance area if the estimated inverted luminance L of that sample is less than 8 and the estimated luminance L of the previous sample is less than 8−2 or 6. Similarly, a sample is determined to belong to a low luminance area if the estimated inverted luminance L of that sample is higher than 12 and the estimated luminance L of the previous sample is higher than 12+2 or 14. The just mentioned thresholds of low and high luminance are given here as an example but depend on the reference voltage used for the analog-to-digital conversion of the television IF signal. The estimated luminances change in accordance with a change of the reference voltage. The thresholds should be exchanged if the modulation is positive instead of negative.

Figure 20:
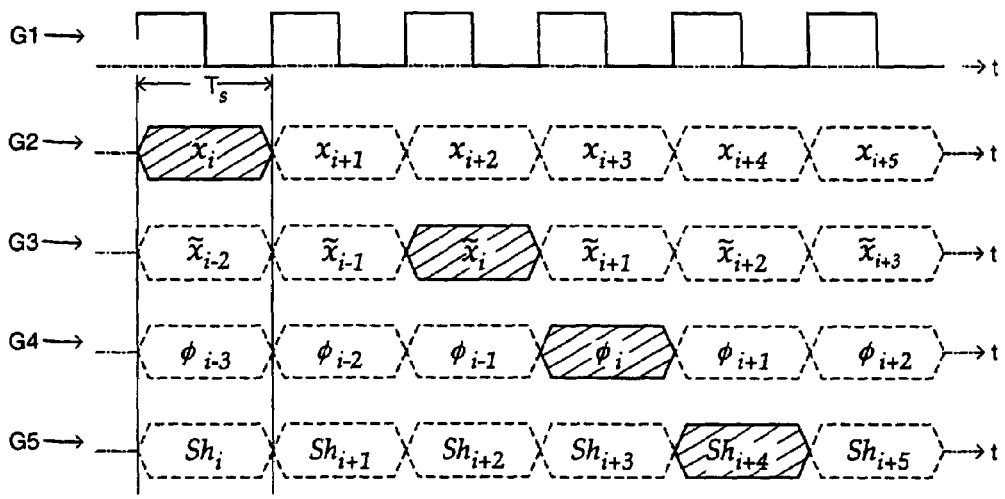
FIG. 20 shows several time diagrams to illustrate the time delay between a sample and a corresponding calculated shift amount.

The shift of the clip range for a given sample depends on the level of the quantized IF carrier. That quantized IF carrier depends on the PLL phase $\Phi$ from the phase-locked loop PLL. The phase used to decide on the shift of the clip range contains compensation for a number of delays. These delays are illustrated in FIG. 20. FIG. 20 shows five graphs G1, G2, G3, G4 and G5. Graph G1 is used as time reference for the other graphs of the same figure and shows a block signal with a period (sampling period $T_s$) and phase corresponding to the sampling rate of the samples x. Graph G2 represents the consecutive incoming samples $x_i$, $x_{i+1}$, ... Graphs G3, G4 and G5 illustrate the following delays:

- a two-sample delay between the shift of the clip range of the prediction errors and the DPCM output (this delay depends on the implementation of the DPCM loops), illustrated in graph G3;
- a one-sample delay caused by the three-tap band-pass filter BPF in the PLL, illustrated in graph G4;
- a one-sample delay between the calculation of the shift amount and the actual shifting of the clip range, illustrated in graph G5 (this delay too depends on the implementation of the embodiment).

For the considered implementation, there is a compensation for a total delay of four samples. Therefore, the sine wave used for the decision on the shift of the clip range is for this embodiment expressed by $\sin(\Phi+4\Delta\Phi)$ or, for NTSC M, $\sin(\Phi+4*(256*2.85/16.2))$, which is $\sin(\Phi+180)$ for an 8-bit representation of the phase.

Figure 18:
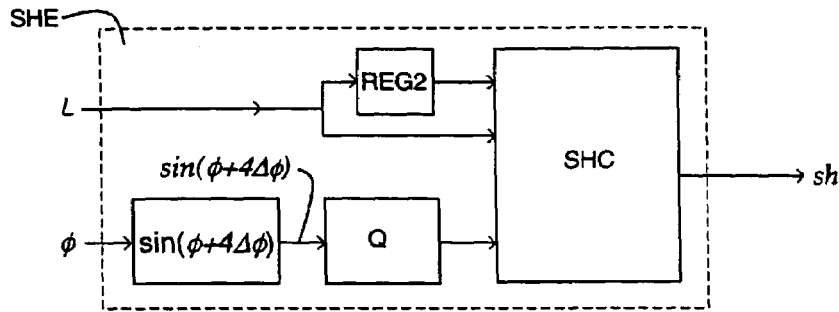
FIG. 18 shows a block diagram of a shift estimator (SHE)

FIG. 18 shows a block diagram of the shift estimator (marked SHE) of this embodiment of the invention as described above, with which the shift sh is obtained from the PLL phase $\Phi$ and the estimated (inverted) luminance L. From the PLL phase $\Phi$, a sine wave $\sin(\Phi+4\Delta\Phi)$ is generated with a sine wave generator $SIN(\Phi+4\Delta\Phi)$. The sine wave $\sin(\Phi+4\Delta\Phi)$ is quantized in a 7-level quantizer Q of which the output is applied to a shift calculator SHC. In the shift calculator SHC, the amount of shift sh of the prediction error clip range is determined as described above.

The implementation of the dejitter in this embodiment includes a register REG2 which delays the estimated luminance L of a sample for the duration of one sample.

The dynamic clip range shifting is by preference implemented in three consecutive steps.

- subtract the shift from the prediction error, what results in a shifted prediction error;
- clip the shifted prediction error to a fixed clip range, for this embodiment to the range [−31 ... +30] (or [−32 ... +31] in the case of unreduced clip range), what results in a clipped shifted prediction error;
- add the shift amount to the clipped shifted prediction error.

Figure 19:
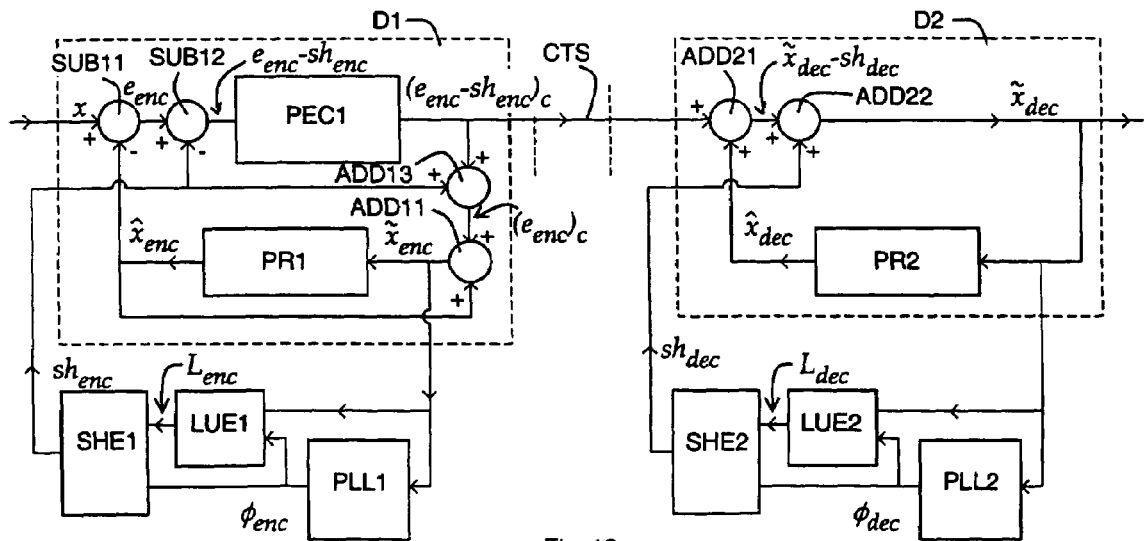
FIG. 19 shows a block diagram illustrating an implementation of a dynamic clip range shifting.

FIG. 19 illustrates the implementation of the dynamic clip range shifting. At the first location, a subtractor SUB12 subtracts the shift $sh_{enc}$ from the prediction error $e_{enc}$, resulting in a shifted prediction error $e_{enc}-sh_{enc}$. The shifted prediction error $e_{enc}-sh_{enc}$ is clipped in the prediction error clipper PEC1 and results in a clipped shifted prediction error $(e_{enc}-sh_{enc})_c$. The shift $sh_{enc}$ is added by adder ADD13 to the clipped shifted prediction error $(e_{enc}-sh_{enc})_c$ and the resulting sum $(e_{enc})_c$ is added by adder ADD11 to the encoder prediction $\tilde{x}_{enc}$ to result in the output $\tilde{x}_{enc}$ of the local decoder in the encoder. At the second location, the shift $sh_{dec}$ is added in an adder ADD22 to the shifted decoder output $\tilde{x}_{dec}-sh_{dec}$ resulting in the decoder output $\tilde{x}_{dec}$.

HDPCM is not implemented in FIG. 19; it is however possible to combine the dynamic clip range shifting with HDPCM as described before because the range of transmitted prediction errors remains [−31 ... +30]. FIG. 5, which is a complete implementation of this embodiment, shows HDPCM combined with dynamic clip range shifting.

Extra-Improving Part to the Combination of Dynamic Clip Range Shifting and HDPCM The implementation of FIG. 19 suggests that the shift sh can be considered as an improvement of the predictor $\tilde{x}$. As a consequence, the input to the prediction mapper (PM1, PM2) of HDPCM when HDPCM and dynamic clip range shifting are combined can be $(\tilde{x}+sh)$ instead of $\tilde{x}$. In this way, not only differences in prediction $\tilde{x}$ but also differences in shift sh between encoder and decoder are also corrected by HDPCM.

The above described first embodiment of the present invention can be implemented in a programmable logic device, by preference working at a clock frequency equal to the sampling frequency of the first digitized television IF frequency.

Although the present invention has been described with reference to the first embodiment of the present invention, the invention is not limited solely to this first embodiment. Digitized television IF signals according to the same or other transmission standards than the one mentioned in the description of the first embodiment, may be transported over the same or other transport channels than the one mentioned in the description, the prediction and the dynamic clip range shifting being adapted to the transmission standard. Another digital signal than a digitized television IF signal can also be transported, again with the prediction and the dynamic clip range shifting being adapted to the parameters of the digital signal. Other values can be chosen for M, N and C (or even P). Moreover, various other preferred choices in the implementation of the first embodiment of the present invention can be made differently.

The first embodiment of the present invention has been described above starting from the implementation of an elementary implementation with reference to FIG. 6, and followed by a step-by-step addition of improving parts to a full implementation shown in FIG. 5. By the improving parts is thereby meant HDPCM, PCM-bit substitution and dynamic clip range shifting.

The invention can, at the expense of a lower grade transport of the digital signal or at the expense of a higher probability for coding errors, be implemented as a combination of the elementary implementation as described in the description of the first embodiment and one or more but not all of the improving parts described in the description of the first embodiment. The below described second and third embodiments of the present invention are two examples of combinations of the elementary implementation and one or more of the improving parts.

Second Preferred Embodiment

The second embodiment of the present invention is a method for the transport of a sample S1 of a first digital signal over a transport channel TC from a first location FL to a second location SL, where it is received as a sample S2 of a second digital signal. The to be transported digital signal and transport channel TC are in particular (but not necessarily) the same as described in the first embodiment, the to be transported digital signal thus being a digitized television IF signal.

The second embodiment is described below with reference to and compared to the description of the first embodiment of this invention and the figures used for it.

Figure 21:
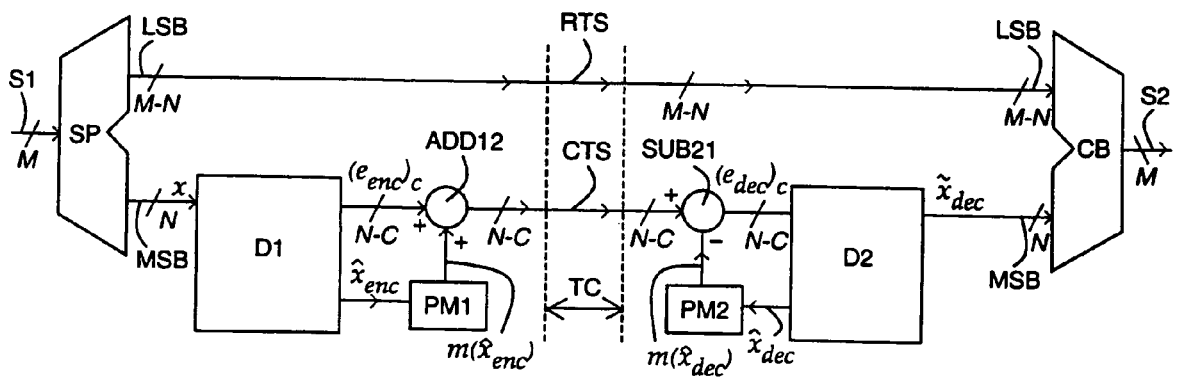
FIG. 21 shows a block diagram, corresponding to the second embodiment of the present invention.

FIG. 21 shows a block diagram of the implementation of the second embodiment. The second embodiment is characterized in that the M–N LSB's are transmitted uncompressed, by preference in PCM, and that the N MSB's are compressed to N–C bits by implementation of the improving part HDPCM with the HDPCM extra-improving part "reduction of the clip range" and/or the HDPCM extra improving part "non-uniform-mapping". In the block diagram of FIG. 21 is thus combined the elementary set-up of FIG. 6 with HDPCM as illustrated in FIG. 10; the extra-improving parts are not visible in FIG. 21.

For a more detailed description of this second embodiment reference is made to the description of the first embodiment, wherein all the parts of this second embodiment are described.

Third Preferred Embodiment

The third embodiment of the present invention is a method for the transport of a sample S1 of a first digital signal over a transport channel TC from a first location FL to a second location SL, where it is received as a sample S2 of a second digital signal. The to be transported digital signal and transport channel TC are in particular (but not necessarily) the same as described in the first embodiment, the to be transported digital signal thus being a digitized television IF signal.

The third embodiment is described below with reference to and in comparison to the description of the first embodiment of this invention and the figures used for it.

FIG. 15, already referred to in the description of the first embodiment, shows a block diagram of the implementation of the third embodiment. The third embodiment is characterized in that the M–N LSB's are transmitted uncompressed, by preference in PCM, and that the N MSB's are compressed to N–C bits by implementation of the improving part "dynamic clip range shifting". In the block diagram of FIG. 15 is thus combined the elementary set-up of FIG. 6 with dynamic clip range shifting as illustrated in FIG. 19.

For a more detailed description of this third embodiment reference is made to the description of the first embodiment, wherein all the parts of this third embodiment are described.

Presented after the following Reference Key are the claims, which define the present invention exemplary embodiments of which are presented above without limitation.

Reference Key:

| Reference sign | Designation of indicated feature |
|---|---|
| ABS | absolute value calculator |
| AD | analog-to-digital converter |
| ADD . . . | adder . . . |
| ADDP | adder in PLL |
| AS1 | first analog signal |
| AS2 | second analog signal |
| BS1 | first location substitutor |
| BS2 | second location substitutor |
| BSC1 | first location clipping detector |
| BSC2 | second location clipping detector |
| c | clipped (index), also noted as ( . . . )$_c$ |
| CB | combiner |
| CE | substitution value |
| CLP | clipper |
| COR | PCM-bit substitution MSB corrector |
| CTS | compressed transport sample |
| D1 | encoder DPCM-core |
| D2 | decoder DPCM-core |
| DA | digital-to-analog converter |
| dec | of decoder (index) |
| 1 | encoder DPCM-core |
| D2 | decoder DPCM-core |
| DA | digital-to-analog converter |
| DS1 | first digital signal |
| DS2 | second digital signal |
| e | prediction error |
| enc | of encoder (index) |
| f | frequency (axis) |
| FL | first location |
| Φ | PLL phase |
| ΦADJ | Φ-adjustment |
| G1 . . . G5 | graph 1 . . . graph 5 |
| H(f) | spectrum amplitude (axis) |
| BPF | band-pass filter |
| IFL | IF signal level |
| L | estimated luminance |
| LSB | least significant bits (PCM-bits) |
| LP11 | first loop of the encoder |
| LP12 | second loop of the decoder |
| LP21 | loop of the decoder |
| LUE | luminance estimator |
| m( . . . ) | mapped value of ( . . . ) |
| MIX | mixer |
| MSB | most significant bits (DPCM-bits) |
| PEC | prediction error clipper |
| PLL | phase-locked loop |
| PM | prediction mapper |
| PR | predictor |
| Q | quantizer |
| Q&CL | quantizer and clipper |
| REC | receiver |
| REG1 | register (in PLL) |
| REG2 | register (in shift estimator) |
| RTS | residual transport sample |
| S1 | sample of the first digital signal (sample of a digitized television IF signal in the embodiments) |
| S2 | sample of the second digital signal (sample of a digitized television IF signal in the embodiments) |
| SC1 | first location PCM-bit substitution control signal |
| SC2 | second location PCM-bit substitution control signal |
| SCL . . . | scale . . . |
| sh | shift (of the clip range) |
| SGN | sign signal |
| SHC | shift calculator |
| SHE | shift estimator |
| $S_i$ | i-th sample of the television IF signal |
| SL | second location |
| SN | sample number (axis) |
| $S_n$ | n-th sample of the television IF signal |
| SP | splitter |
| SUB | subtractor |
| SV | sample value (axis) |
| t | time (axis) |
| TRA | transmitter |
| TC | transport channel |
| TCBS | transport channel bit-stream |
| $T_s$ | sampling period |
| VLC | variable length coder |
| VLD | variable length decoder |
| wr( . . . ) | wrapped-around value of ( . . . ) |
| x | sample (of a digital signal to be transported) |

-continued

| Reference sign | Designation of indicated feature |
|---|---|
| x̂ | prediction (of a decoder, or of a local decoder in an encoder) |
| x̃ | output signal(of a decoder, or of a local decoder in an encoder) |
| ZCC | zero-cross comparator |

What is claimed is:

1. Receiving apparatus wherein a transport channel bit-stream (TCBS), which contains a first digitized television IF signal represented by transport samples composed of at least a N–C-bits compressed transport sample (CTS) and a (M–N)-bits residual transport sample (RTS) and which is either obtained through compression or is transmitted, is transformed into a second digitized television IF signal, comprising:
   an input for the transport channel bit-stream (TCBS),
   a decoder DPCM-core (D2) for decompressing the N–C bits of a compressed transport sample (CTS) to N MSB's of an output sample (S2),
   a combiner (CB) for combining the M–N LSB's and N MSB's of a sample to an output sample (S2),
   a second location clipping detector (BSC2) which generates a second location PCM-bit substitution control signal (SC2), indicating what is to be selected as M–N least significant bits of the output sample (S2), and a sign signal (SGN), being the sign bit of a transmitted transformed clipping error,
   a second location substitutor (BS2) which switches between the received M–N LSB's from the residual transport sample (RTS) and a replacement according to the second location PCM-bit substitution control signal (SC2), and
   an MSB corrector (COR) which adds to or subtracts from the result of adder ADD21 in the decoder DPCM-core (D2) and the output value of mapping the received transport sample (RTS) by means of a second function, according to the second location PCM-bit substitution control signal (SC2) and the sign signal (SGN).

2. Receiving apparatus according to claim 1 further comprising:
   a prediction mapper (PM2) for generating a mapped prediction $(m(\hat{x}_{dec}))$ from a decoder prediction $(\hat{x}_{dec})$ from the decoder DPCM-core (D2), whereby the prediction mapper (PM2) comprises means for one of a uniform mapping and a non-uniform mapping, and
   a subtractor (SUB21) which subtracts the mapped prediction $(m(\hat{x}_{dec}))$ from the sample of the compressed transport stream (CTS) and which then does a wrap-around of the result of the subtraction, obtaining to a clipped prediction error $((e_{dec})_c)$.

3. Receiving apparatus according to claim 1 further comprising:
   a phase-locked loop (PLL2) which estimates a phase $(\Phi_{dec})$ of the IF carrier based on a decoded television if signal $(\hat{x}_{dec})$ from the decoder DPCM-core (D2),
   a luminance estimator (LUE2) which estimates the luminance of the video signal contained in the television IF signal based on the decoded television IF signal $(\hat{x}_{dec})$ and on the said estimated phase $(\Phi_{dec})$ of the IF carrier, resulting in an estimated luminance $(L_{dec})$, and
   a shift estimator (SHE2) which estimates the amount of shift $(Sh_{dec})$ based on the said estimated phase $(\Phi_{dec})$ of the IF carrier and on said estimated luminance $(L_{dec})$, and
   wherein said decoder CPCM-core (D2) comprises means to decode prediction errors which have been clipped in the encoder at a corresponding transmitting apparatus to a clip range which has been shifted there by an amount indicated by a shift estimator (SHE1).

4. Receiving apparatus according to claim 3, further comprising:
   a prediction mapper (PM2) for generating a mapped value (m(y)) from one of the decoder prediction $y=\hat{x}_{dec}$ and the sum $y=\hat{x}_{dec}+sh$ of decoder prediction $\hat{x}_{dec}$ from the decoder DPCM-core (D2) and the shift amount sh, whereby the prediction mapper (PM2) comprises means for one of a uniform mapping and a non-uniform mapping, and
   a subtractor (SUB21) which subtracts the mapped value (m(y)) from the sample of the compressed transport stream (CTS) and which then does a wrap-around of the result of the subtraction, obtaining so a clipped prediction error $((e_{dec})_c)$.

5. Receiving apparatus wherein a transport channel bit-stream (TCBS), containing a first digitized television IF signal represented by transport samples composed of at least a (N–C)-bits compressed transport sample (CTS) and either being compressed or transmitted, is transformed into a second digitized television IF signal, comprising,
   an input for the transport channel bit-stream (TCBS),
   a decoder DPCM-core (D2) for decompressing the N–C bits of a compressed transport sample (CTS) to N bits of an output sample (S2),
   a prediction mapper (PM2) for generating a mapped prediction $(m(\hat{x}_{dec}))$ from a decoder prediction $(\hat{x}_{dec})$ from the decoder DPCM-core (D2), whereby the prediction mapper (PM2) comprises means for one of a uniform mapping and a non-uniform mapping, and
   a subtractor (SUB21) which subtracts the mapped prediction $(m(\hat{x}_{dec}))$ from the sample of the compressed transport stream (CTS) and which then does a wrap-around of the result of the subtraction, obtaining so a clipped prediction error $((e_{dec})_c)$.

6. Receiving apparatus wherein a transport channel bit-stream (TCBS), containing a first digitized television if signal represented by transport samples composed of at least a (N–C)-bits compressed transport sample (CTS) and either being compressed or transmitted, is transformed into a second digitized television IF signal, comprising,
   an input for the transport channel bit-stream (TCBS),
   a decoder DPCM-core (D2) for decompressing the N–C bits of a sample of the compressed transport stream (CTS) to N bits of an output sample (S2),
   a phase-locked loop (FLL2) which estimates a phase $(\Phi_{dec})$ of the if carrier based on a decoded television if signal $(\hat{x}_{dec})$ from the decoder DPCM-core (D2),
   a luminance estimator (LUE2) which estimates the luminance of the video signal contained in the television IF signal based on the decoded television IF signal $(\hat{x}_{dec})$ and on the said estimated phase $(\Phi_{dec})$ of the IF carrier, resulting in an estimated luminance $(L_{dec})$, and a shift estimator (SHE2) which estimates the amount of shift $(Sh_{dec})$ based on said estimated phase $(\Phi_{dec})$ of the IF carrier and on said estimated luminance $(L_{dec})$, wherein said decoder CPCM-core (D2) comprises means to decode prediction errors which have been clipped in the encoder at a corresponding transmitting apparatus to a clip range which has been shifted there by an amount indicated by a shift estimator (SHE1).

7. Receiving apparatus according to claim 6, further comprising:
a prediction mapper (PM2) for generating a mapped value (m(y)) from the decoder prediction $y=\hat{x}_{dec}$ or the sum $y=\hat{x}_{dec}+sh$ of decoder prediction $\hat{x}_{dec}$ from the decoder CPCM-core (D2) and the shift amount sh, whereby the prediction mapper (PM2) comprises means for one of a uniform mapping and a non-uniform mapping, and
a subtractor (SUB21) which subtracts the mapped value (m(y)) from the sample of the compressed transport stream (CTS) and which then does a wrap-around of the result of the subtraction, obtaining so a clipped prediction error $((e_{dec})_c)$.

* * * * *